(12) United States Patent
Matsuzawa et al.

(10) Patent No.: US 10,522,772 B2
(45) Date of Patent: Dec. 31, 2019

(54) PHOTOELECTRIC CONVERSION ELEMENT AND SOLID-STATE IMAGING APPARATUS

(71) Applicant: SONY SEMICONDUCTOR SOLUTIONS CORPORATION, Kanagawa (JP)

(72) Inventors: Nobuyuki Matsuzawa, Tokyo (JP); Yuta Hasegawa, Kanagawa (JP); Yoshiaki Obana, Kanagawa (JP); Ichiro Takemura, Kanagawa (JP); Tetsuji Yamaguchi, Kanagawa (JP); Osamu Enoki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/317,447

(22) PCT Filed: Jun. 8, 2017

(86) PCT No.: PCT/JP2017/021262
§ 371 (c)(1),
(2) Date: Jan. 11, 2019

(87) PCT Pub. No.: WO2018/016215
PCT Pub. Date: Jan. 25, 2018

(65) Prior Publication Data
US 2019/0229151 A1    Jul. 25, 2019

(30) Foreign Application Priority Data

Jul. 20, 2016   (JP) ................................. 2016-142547

(51) Int. Cl.
*H01L 51/42*    (2006.01)
*H01L 27/30*    (2006.01)
(Continued)

(52) U.S. Cl.
CPC ............ *H01L 51/42* (2013.01); *H01L 27/146* (2013.01); *H01L 27/286* (2013.01); *H01L 27/30* (2013.01);
(Continued)

(58) Field of Classification Search
CPC ..... H01L 27/30; H01L 27/301; H01L 27/307; H01L 2031/0344; H01L 51/42; H01L 51/4206
See application file for complete search history.

(56) References Cited

U.S. PATENT DOCUMENTS

2007/0103068 A1* 5/2007 Bawendi ................ B82Y 20/00
                                                          313/506
2010/0084011 A1   4/2010 Forrest et al.
(Continued)

FOREIGN PATENT DOCUMENTS

JP    2003-234460    8/2003
JP    2005-303266    10/2005
(Continued)

OTHER PUBLICATIONS

Cnops et al., "Energy Level Tuning of Non-Fullerene Acceptors in Organic Solar Cells," Journal of the American Chemical Society, vol. 137, Jun. 24, 2015, pp. 8991-8997.
International Search Report prepared by the Japan Patent Office dated Aug. 4, 2017, for International Application No. PCT/JP2017/021262.
(Continued)

*Primary Examiner* — Eduardo A Rodela
(74) *Attorney, Agent, or Firm* — Sheridan Ross P.C.

(57) ABSTRACT

A photoelectric conversion element according to an embodiment of the present disclosure includes a first electrode and a second electrode opposed to each other; and a photoelectric conversion layer provided between the first electrode and the second electrode, and including a first organic semiconductor material and a second semiconductor material that have mutually different mother skeletons, in which
(Continued)

the first organic semiconductor material is fullerene or a fullerene derivative, and the second organic semiconductor material has a deeper HOMO level than the first organic semiconductor material.

15 Claims, 11 Drawing Sheets

(51) Int. Cl.
  *H01L 27/146* (2006.01)
  *H01L 31/10* (2006.01)
  *H01L 27/28* (2006.01)
  *H01L 51/00* (2006.01)

(52) U.S. Cl.
  CPC .......... *H01L 27/301* (2013.01); *H01L 27/307* (2013.01); *H01L 31/10* (2013.01); *H01L 51/424* (2013.01); *H01L 51/4206* (2013.01); *H01L 51/4253* (2013.01); *H01L 51/008* (2013.01); *H01L 51/0046* (2013.01); *H01L 51/0047* (2013.01); *H01L 51/0053* (2013.01); *H01L 51/0072* (2013.01); *H01L 51/0073* (2013.01); *H01L 51/0078* (2013.01)

(56) References Cited

U.S. PATENT DOCUMENTS

| | | | |
|---|---|---|---|
| 2012/0091923 A1* | 4/2012 | Kastner-Jung | ......... B60Q 3/745 315/360 |
| 2016/0254471 A1 | 9/2016 | Forrest et al. | |
| 2017/0054089 A1* | 2/2017 | Obana | ................ H01L 51/0072 |
| 2017/0141312 A1 | 5/2017 | Enoki | |
| 2019/0013342 A1* | 1/2019 | Kato | ...................... H01L 51/42 |

FOREIGN PATENT DOCUMENTS

| | | | | |
|---|---|---|---|---|
| JP | 2007-200921 | | 8/2007 | |
| JP | 2010-067642 | | 3/2010 | |
| JP | 2014-506736 | | 3/2014 | |
| JP | 2015-008310 | | 1/2015 | |
| JP | 2016-009722 | | 1/2016 | |
| JP | WO2016/194630 | * | 8/2016 | ........... H01L 27/146 |
| WO | WO 2015/061771 | | 4/2015 | |
| WO | WO 2015/170219 | | 11/2015 | |
| WO | WO 2016/104173 | | 6/2016 | |

OTHER PUBLICATIONS

Extended European Search Report for European Patent Application No. 17830735.1, dated Jun. 26, 2019, 7 pages.

* cited by examiner

PHOTOELECTRIC CONVERSION ELEMENT AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2017/021262 having an international filing date of 8 Jun. 2017, which designated the United States, which PCT application claimed the benefit of Japanese Patent Application No. 2016-142547 filed 20 Jul. 2016, the entire disclosures of each of which are incorporated herein by reference.

TECHNICAL FIELD

The present disclosure relates to a photoelectric conversion element using an organic semiconductor material, for example, and a solid-state imaging apparatus including the same.

BACKGROUND ART

In recent years, in a solid-state imaging apparatus such as a CCD (Charge Coupled Device) image sensor or a CMOS (Complementary Metal Oxide Semiconductor) image sensor, miniaturization of pixel size has been under way. This causes a reduction in the number of photons entering a unit pixel, thus resulting in reduced sensitivity and a lower S/N ratio. In addition, in a case where a color filter including two-dimensionally arranged primary color filters of red, green, and blue is used for colorization, green light and blue light are absorbed by the color filter in a red pixel, for example, thus leading to the reduced sensitivity. Moreover, upon generation of a signal of each color, interpolation processing is performed between the pixels, thus generating a false color.

Hence, for example, PTL 1 discloses an image sensor using an organic photoelectric conversion film having a multilayer structure in which an organic photoelectric conversion film having sensitivity to blue light (B), an organic photoelectric conversion film having sensitivity to green light (G), and an organic photoelectric conversion film having sensitivity to red light (R) are sequentially stacked. In this image sensor, sensitivity is improved by separate extraction of signals of B/G/R from one pixel. PTL 2 discloses an imaging element in which a single-layer organic photoelectric conversion film is formed, a signal of one color is extracted in the organic photoelectric conversion film, and signals of two colors are extracted through silicon (Si) bulk spectroscopy.

In such an imaging element that extracts the signals of the two colors through the Si bulk spectroscopy and extracts the signal of the one color in the organic photoelectric conversion film provided on a Si bulk, the organic photoelectric conversion film is formed with a combination of two kinds of materials, for example. In PTL 3 and PTL 4, for example, fullerenes, subphthalocyanines, and quinacridones are used in combination.

CITATION LIST

Patent Literature

PTL 1: Japanese Unexamined Patent Application Publication No. 2003-234460

PTL 2: Japanese Unexamined Patent Application Publication No. 2005-303266

PTL 3: Japanese Unexamined Patent Application Publication No. 2014-506736

PTL 4: Japanese Unexamined Patent Application Publication No. 2016-009722

SUMMARY OF THE INVENTION

Incidentally, a solid-state imaging apparatus is desired to have an excellent spectral shape in order to obtain an image having favorable color reproducibility. In addition, the solid-state imaging apparatus is desired to have response time speed (high responsivity) necessary for a photocurrent to rise or fall in response to turning on or off of light, and high external quantum efficiency (External Quantum Efficiency: EQE) for higher sensitivity.

It is desirable to provide a photoelectric conversion element that makes it possible achieve an excellent spectral shape, high responsivity, and high external quantum efficiency, and a solid-state imaging apparatus including the same.

A photoelectric conversion element according to an embodiment of the present disclosure includes a first electrode and a second electrode opposed to each other; and a photoelectric conversion layer provided between the first electrode and the second electrode, and including a first organic semiconductor material and a second semiconductor material that have mutually different mother skeletons, in which the first organic semiconductor material is fullerene or a fullerene derivative, and the second organic semiconductor material has a deeper HOMO level than the first organic semiconductor material.

A solid-state imaging apparatus according to an embodiment of the present disclosure includes one or a plurality of photoelectric conversion elements according to the foregoing embodiment of the present disclosure for each of a plurality of pixels.

In the photoelectric conversion element according to the embodiment of the present disclosure and the solid-state imaging apparatus according to the embodiment of the present disclosure, the photoelectric conversion layer is formed using the first organic semiconductor material and the second organic semiconductor material that have mutually different mother skeletons. Herein, the first organic semiconductor material is fullerene or the fullerene derivative, and the second organic semiconductor material has a deeper HOMO level than the first organic semiconductor material. This allows fullerene and the fullerene derivative to be used as a p-type semiconductor and makes it possible to improve hole mobility and electron mobility in the photoelectric conversion layer while maintaining a sharp spectral shape. This also makes it possible to enhance charge transport efficiency after excitons generated by light absorption are dissociated into charges.

According to the photoelectric conversion element of the embodiment of the present disclosure and the solid-state imaging apparatus of the embodiment of the present disclosure, the photoelectric conversion layer is formed using the first organic semiconductor material and the second organic semiconductor material described above, which makes it possible to obtain a sharp spectral shape, high charge mobility, and high charge transport efficiency. This makes it possible to provide a photoelectric conversion element having an excellent spectral shape, high responsivity, and high EQE, and a solid-state imaging apparatus including the same.

It is to be noted that effects described here are not necessarily limited and any of effects described in the present disclosure may be included.

MODES FOR CARRYING OUT THE INVENTION

Figure 1:
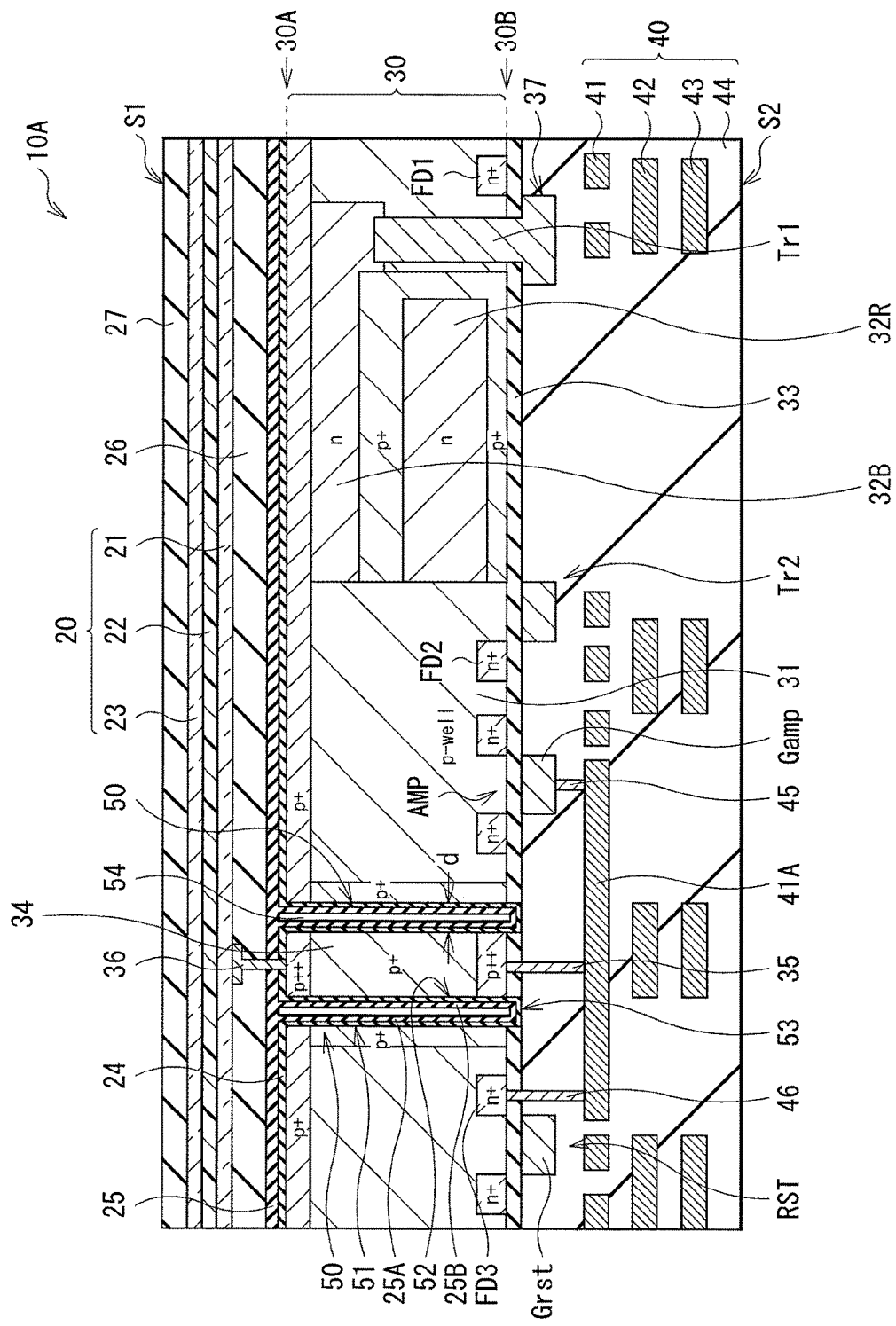
FIG. 1 is a cross-sectional view of an example of a schematic configuration of a photoelectric conversion element according to a first embodiment of the present disclosure.

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.
1. First Embodiment (Example of a photoelectric conversion layer including three kinds of materials)
1-1. Configuration of Photoelectric Conversion Element
1-2. Method of Manufacturing Photoelectric conversion element
1-3. Workings and Effects
2. Second Embodiment (Example of photoelectric conversion layer including two kinds of materials)
3. Application Examples
4. Examples 1. First Embodiment FIG. 1 illustrates a cross-sectional configuration of a photoelectric conversion element (a photoelectric conversion element 10A) according to a first embodiment of the present disclosure. The photoelectric conversion element 10A configures a pixel (a unit pixel P) in a solid-state imaging apparatus (a solid-state imaging apparatus 1: see FIG. 7) such as a CMOS image sensor used in an electronic apparatus such as a digital still camera, or a video camera, for example.

1-1. Configuration of Photoelectric Conversion Element

The photoelectric conversion element 10A is of a so-called longitudinal spectral type in which, for example, one organic photoelectric converter 20 and two inorganic photoelectric converters 32B and 32R are stacked in a longitudinal direction. The organic photoelectric converter 20 is provided on a side on which a first surface (back side) 30A is located of a semiconductor substrate 30. The inorganic photoelectric converters 32B and 32R are formed to be embedded in the semiconductor substrate 30, and are stacked in a thickness direction of the semiconductor substrate 30. The organic photoelectric converter 20 includes a p-type semiconductor and an n-type semiconductor, and includes a photoelectric conversion layer 22 having a bulk heterojunction structure in a layer. The heterojunction structure is a p/n junction surface formed through mixture of the p-type semiconductor and the n-type semiconductor. In the present embodiment, the photoelectric conversion layer 22 includes three kinds of organic semiconductor materials (a first organic semiconductor layer, a second organic semiconductor layer, and a third organic semiconductor layer) that have mutually different mother skeletons.

The organic photoelectric converter 20 and the inorganic photoelectric converters 32B and 32R selectively detect light in mutually different wavelength ranges to perform photoelectric conversion. Specifically, the organic photoelectric converter 20 acquires a green (G) color signal. The inorganic photoelectric converters 32B and 32R respectively acquire a blue (B) color signal and a red (R) color signal by a difference in absorption coefficient. This allows the photoelectric conversion element 10A to acquire a plurality of color signals in one pixel without using a color filter.

It is to be noted that in the present embodiment, description is given of a case where electrons of electron-hole pairs generated by photoelectric conversion are read as signal charges (in a case where an n-type semiconductor region serves as a photoelectric conversion layer). Moreover, in the drawings, "+(plus)" attached to "p" or "n" indicates that p-type or n-type impurity concentration is high, and "++" indicates that p-type or n-type impurity concentration is higher than that in a case of "+".

For example, floating diffusions (floating diffusion layers) FD1, FD2, and FD3, a vertical type transistor (transfer transistor) Tr1, a transfer transistor Tr2, an amplifier transistor (modulation element) AMP, a reset transistor RST, and multilayer wiring 40 are provided on a second surface (front side) 30B of the semiconductor substrate 30. The multilayer wiring 40 has a configuration in which wiring layers 41, 42, and 43 are stacked in an insulation layer 44.

It is to be noted that in the drawings, the side on which the first surface 30A is located of the semiconductor substrate 30 is represented as a light entering side S1 and a side on which the second surface 30B is located of the semiconductor substrate 30 is represented as a wiring layer side S2.

The organic photoelectric converter 20 has a configuration in which, for example, a lower electrode 21, the photoelectric conversion layer 22, and an upper electrode 23 are stacked in this order from the side on which the first surface 30A is located of the semiconductor substrate 30. The lower electrode 21 is formed separately for each photoelectric conversion element 10A, for example. The photoelectric conversion layer 22 and the upper electrode 23 are provided as a continuous layer common to a plurality of photoelectric conversion elements 10A. For example, a layer having fixed charges (a fixed charge layer 24), a dielectric layer 25 having an insulating property, and an inter-layer insulation layer 26 are provided between the first surface 30A of the semiconductor substrate 30 and the lower electrode 21. A protective layer 27 is provided on the upper electrode 23. Optical members such as a planarization layer and an on-chip lens (both not illustrated) are disposed above the protective layer 27.

A through electrode 34 is provided between the first surface 30A and the second surface 30B of the semiconductor substrate 30. The organic photoelectric converter 20 is coupled to a gate Gamp of the amplifier transistor AMP and the floating diffusion FD3 via through electrode 34. This allows the photoelectric conversion element 10A to well transfer the charges generated in the organic photoelectric converter 20 on the side on which the first surface 30A is located of the semiconductor substrate 30 to the side on which the second surface 30B is located of the semiconductor substrate 30 via the through electrode 34, thereby improving characteristics.

The through electrode 34 is provided in each organic photoelectric converter 20 in each of the photoelectric conversion elements 10A, for example. The through electrode 34 has a function as a connector between the organic photoelectric converter 20 and the gate Gamp of the amplifier transistor AMP and the floating diffusion FD3, and is a transmission path of the charges (herein, the electrons) generated in the organic photoelectric converter 20. A lower end of the through electrode 34 is coupled to a connection unit 41A in the wiring layer 41 of the multilayer wiring 40 via a first lower contact 35, for example. The connection unit 41A and the gate Gamp of the amplifier transistor AMP are coupled via a second lower contact 45. The connection unit 41A and the floating diffusion FD3 are coupled via a third lower contact 46. A top edge of the through electrode 34 is coupled to the lower electrode 21 via an upper contact 36, for example.

It is preferable that a reset gate Grst of the reset transistor RST be located next to the floating diffusion FD3, as illustrated in FIG. 1. This makes it possible to reset the charges accumulated in the floating diffusion FD3 by the reset transistor RST.

The through electrode 34 penetrates the semiconductor substrate 30 and is separated from the semiconductor substrate 30 by a separation groove 50, for example. It is preferable that, for example, the through electrode 34 include the same semiconductor as the semiconductor substrate 30, for example, silicon (Si), and have a resistance value reduced by injection of the n-type or the p-type impurity (indicated by p+ in FIG. 1, for example). It is also preferable that a high-concentration impurity region (indicated by p++ in FIG. 1, for example) be provided in an upper end section and a lower end section of the through electrode 34 and connection resistance with the upper contact 36 and connection resistance with the first lower contact 35 be further reduced. The through electrode 34 may include metal or a conductive material. Use of the metal or the conductive material makes it possible to further reduce the resistance value of the through electrode 34 and further reduce the connection resistance of the through electrode 34 with the first lower contact 35, the second lower contact 45, and the third lower contact 46. As the metal or the conductive material included in the through electrode 34, aluminum (Al), tungsten (W), titanium (Ti), cobalt (Co), hafnium (Hf), tantalum (Ta), etc. are adopted.

As illustrated in FIG. 1, an outer surface 51, an inner surface 52, and a bottom surface 53 of the separation groove 50 are covered by the dielectric layer 25 having an insulating property, for example. The dielectric layer 25 has an outer dielectric layer 25A covering the outer surface 51 of the separation groove 50 and an inner dielectric layer 25B covering the inner surface 52 of the separation groove 50. It is preferable that a cavity 54 be provided between the outer dielectric layer 25A and the inner dielectric layer 25B. That is, the separation groove 50 is circular or annular, and the cavity 54 is circular or annular, forming a concentric circle with the separation groove 50. This reduces electrostatic capacitance generated between the through electrode 34 and the semiconductor substrate 30, thus making it possible to improve conversion efficiency and suppressing a delay (afterimage).

It is also preferable that an impurity region (indicated by p+ in FIG. 1) of a same conductivity type (n-type or p-type) as the through electrode 34 is provided in the semiconductor substrate 30 on the outer surface 51 of the separation groove 50. Furthermore, it is preferable that the fixed charge layer 24 be provided on the outer surface 51, the inner surface 52, and the bottom surface 53 of the separation groove 50, and the first surface 30A of the semiconductor substrate 30. Specifically, it is preferable that in the semiconductor substrate 30 on the outer surface 51 of the separation groove 50, the p-type impurity region (indicated by p+ in FIG. 1) be provided and a film having negative fixed charges be provided as the fixed charge layer 24. This allows for reduction in a dark current.

In the photoelectric conversion element 10A of the present embodiment, light entering the organic photoelectric converter 20 from a side on which the upper electrode 23 is located is absorbed by the third organic semiconductor material of the photoelectric conversion layer 22. The excitons generated thereby move to an interface between an electron donor (for example, the first organic semiconductor material) and an electron acceptor (for example, the second organic semiconductor material), and the excitons are dissociated, that is, the excitons are dissociated to the electrons and the holes. The charges generated herein (electrons and holes) are each carried to different electrodes by diffusion resulting from a difference in concentration between carriers or an internal electric field resulting from a difference in work function between an anode (herein, the lower electrode 21) and a cathode (herein, the upper electrode 23), and detected as the photocurrent. It is also possible to control a transport direction of the electrons and the holes by application of a potential between the lower electrode 21 and the upper electrode 23.

In the following, description is given of the configurations, materials, etc. of respective components.

The organic photoelectric converter 20 is an organic photoelectric conversion element that absorbs green light corresponding to a portion or the entirety of a selective wavelength range (for example, 450 nm or higher and 650 nm or lower) to generate the electron-hole pairs.

The lower electrode 21 is directly opposed to light receiving surfaces of the inorganic photoelectric converters 32B and 32R formed in the semiconductor substrate 30, and is provided on regions covering the light receiving surfaces. The lower electrode 21 includes a conductive film having optical transparency, and includes an ITO (indium tin oxide), for example. However, as a constituent material of the lower electrode 21, in addition to ITO, a tin oxide ($SnO_2$)-based material to which a dopant is added or a zinc oxide-based material prepared through adding a dopant to aluminum zinc oxide (ZnO) may be used. Examples of the zinc oxide-based material include aluminum zinc oxide (AZO) to which aluminum (Al) is added as a dopant, gallium (Ga)-added gallium zinc oxide (GZO), and indium (In)-added indium zinc oxide (IZO). In addition to these materials, CuI, $InSbO_4$, ZnMgO, $CuInO_2$, $MgIN_2O_4$, CdO, $ZnSnO_3$, etc. may also be used.

The photoelectric conversion layer 22 converts optical energy into electric energy. The photoelectric conversion layer 22 includes an organic semiconductor material that functions as a p-type semiconductor or an n-type semiconductor. The photoelectric conversion layer 22 has the junction surface (the p/n junction surface) between the p-type semiconductor and the n-type semiconductor in the layer. The p-type semiconductor relatively functions as an electron donor (a donor) and the n-type semiconductor relatively functions as an electron acceptor (an acceptor). The photoelectric conversion layer 22 provides a field where excitons generated upon absorption of light are dissociated into electrons and holes. Specifically, the excitons are dissociated into the electrons and the holes at an interface (the p/n junction surface) between the electron donor and the electron acceptor. A thickness of the photoelectric conversion layer 22 is 50 nm to 500 nm, for example.

In the present embodiment, the photoelectric conversion layer 22 includes three kinds, i.e., the first organic semiconductor material, the second organic semiconductor material, and the third organic semiconductor material, which have mutually different mother skeletons.

The first organic semiconductor material functions as the p-type semiconductor, and is preferably a material having a high hole transporting property. Specific examples thereof include C60 fullerene or a derivative thereof expressed by the following general formula (1) and C70 fullerene or a derivative thereof expressed by the following general formula (2). It is to be noted that in the present disclosure, fullerenes are treated as organic semiconductor materials.

[Chem.1]

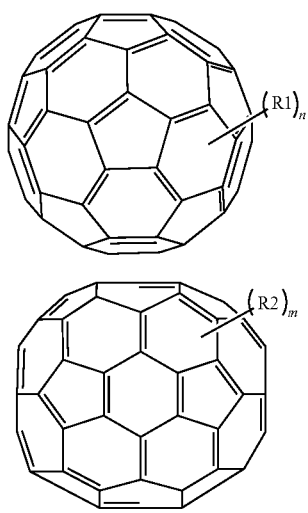

(R1 and R2 are each independently one of a hydrogen atom, a halogen atom, a straight-chain, branched, or cyclic alkyl group, a phenyl group, a group having a straight-chain or condensed ring aromatic compound, a group having a halogen compound, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino acid, an acyloxy group, a carbonyl group, a carboxy group, a carboxamide group, a carboalkoxy group, an acyl group, a sulfonyl group, a cyano group, a nitro group, a group having a chalcogen compound, a phosphine group, a phosphone group, or derivatives thereof. Each of n and m is an integer of 2 or larger.)

Specific examples of C60 fullerene and a derivative thereof expressed by the general formula (1) include compounds expressed by the following formulas (1-1) to (1-3), etc. Specific examples of C70 fullerene and a derivative thereof expressed in the general formula (2) include compounds expressed by the following formulas (2-1) and (2-2), etc.

[Chem. 2]

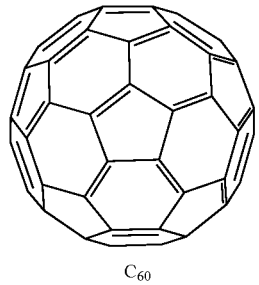

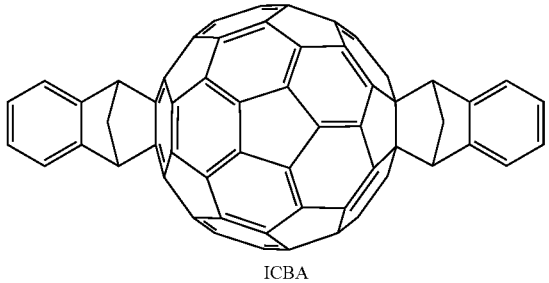

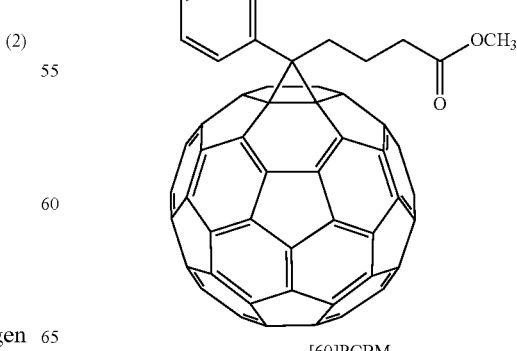

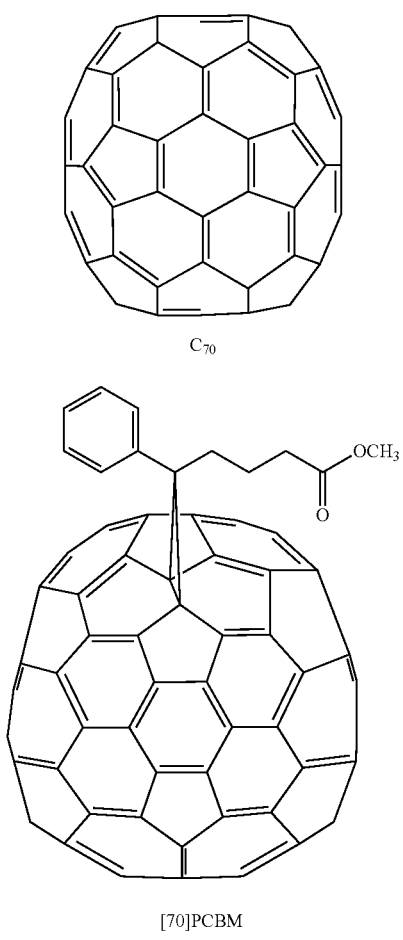

(2-1)

C<sub>70</sub>

(2-2)

[70]PCBM

The first organic semiconductor material is preferably a material having a high hole transporting property as described above. Table 1 is a summary of hole mobility of C60 fullerene (the formula (1-1)), C70 fullerene (the formula (2-1)), and the fullerene derivatives expressed by the formula (1-2), the formula (1-3), and the formula (2-2). Use of an organic semiconductor material having high hole mobility, preferably hole mobility of $10^{-7}$ cm²/Vs or higher, or more preferably hole mobility of $10^{-4}$ cm²/Vs or higher improves mobility of holes resulting from separation of excitons into charges and enhances responsivity of the organic photoelectric converter 20.

TABLE 1

| | Hole Mobility (cm²/Vs) |
|---|---|
| C60 fullerene | $2 \times 10^{-4}$ |
| C70 fullerene | $5 \times 10^{-5}$ |
| [60]PCBM | $1 \times 10^{-4}$ |
| [70]PCBM | $2 \times 10^{-5}$ |
| ICBA | $1 \times 10^{-4}$ |

The second organic semiconductor material functions as an n-type semiconductor, and has a deeper HOMO level than the first organic semiconductor material. It is also preferable that the second organic semiconductor material have higher electron mobility in a form of a single-layer film than electron mobility in a form of a single-layer film of the first organic semiconductor material. Furthermore, it is preferable that the second organic semiconductor material have a deeper LUMO level than the third organic semiconductor material, and have a high electron transporting property. Specifically, it is preferable that the second organic semiconductor material have higher electron mobility in the form of the single-layer film than electron mobility in the form of the single-layer film of the third organic semiconductor material.

The third organic semiconductor material photoelectrically converts light in a predetermined wavelength range, and allows light in other wavelength ranges to pass therethrough. Specifically, it is preferable that the third organic semiconductor material in the form of a single-layer film have a higher linear absorption coefficient of a maximal absorption wavelength in a visible region (for example, 450 nm or higher and 800 nm or lower) than a single-layer film of the first organic semiconductor material and a single-layer film of the second organic semiconductor material. This makes it possible to increase absorption of light in the visible region of a photoelectric conversion layer 17. It is further preferable that the third organic semiconductor material have a sharp spectral shape in a selective wavelength range (for example, 450 nm or higher and 650 nm or lower). This makes it possible to obtain an excellent spectral shape.

Examples of the second organic semiconductor material and the third organic semiconductor material include subphthalocyanine and a derivative thereof expressed by the following general formula (3), hexaazatrinaphthylene and a derivative thereof expressed by the following general formula (4), naphthalene tetracarboxylic dianhydride and a derivative thereof expressed by the following general formula (5), and naphthalene diimide and a derivative thereof expressed by the following general formula (6).

[Chem. 3]

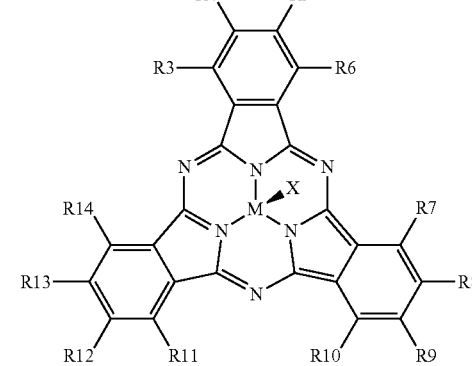

(3)

(R3 to R14 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group and a derivative thereof, a carboxy group, a carboxamide group, a carboalkoxy group, an acyl group, a sulfonyl group, a cyano group, and a nitro group, and any adjacent ones of R3 to R14 are optionally part of a condensed aliphatic ring or a condensed aromatic ring. The condensed aliphatic ring or the condensed aromatic ring described above optionally includes one or more atoms other than carbon. M is boron or a divalent or trivalent metal. X is an anionic group.)

[Chem. 4]

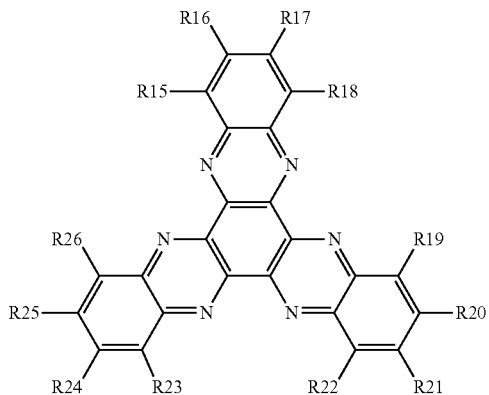

(4)

(R15 to R26 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group and a derivative thereof, a carboxy group, a carboxamide group, a carboalkoxy group, an acyl group; a sulfonyl group, a cyano group, and a nitro group, and any adjacent ones of R15 to R26 are optionally part of a condensed aliphatic ring or a condensed aromatic ring. The condensed aliphatic ring or the condensed aromatic ring described above optionally includes one or more atoms other than carbon.)

[Chem. 5]

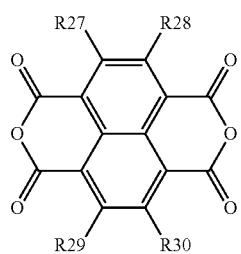

(5)

(R27 to R30 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group and a derivative thereof, a carboxy group, a carboxamide group, a carboalkoxy group, an acyl group, a sulfonyl group, a cyano group, and a nitro group, and any adjacent ones of R27 to R30 are optionally part of a condensed aliphatic ring or a condensed aromatic ring. The condensed aliphatic ring or the condensed aromatic ring described above optionally includes one or more atoms other than carbon.)

[Chem. 6]

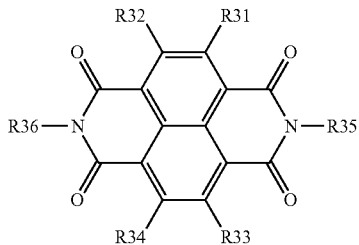

(6)

(R31 to R36 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group and a derivative thereof, a carboxy group, a carboxamide group, a carboalkoxy group, an acyl group, a sulfonyl group, a cyano group, and a nitro group, and any adjacent ones of R31 to R36 are optionally part of a condensed aliphatic ring or a condensed aromatic ring. The condensed aliphatic ring or the condensed aromatic ring described above optionally includes one or more atoms other than carbon.)

Specific examples of subphthalocyanine and the derivative thereof expressed by the following general formula (3) include compounds expressed by the following formulas (3-1) to (3-8), etc.

[Chem. 7]

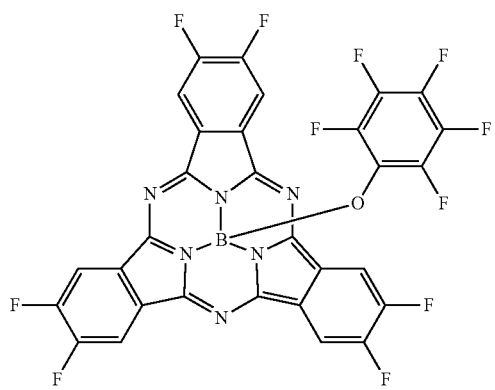

(3-1)

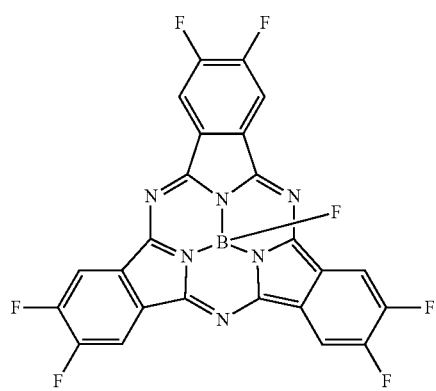

(3-2)

(3-3)
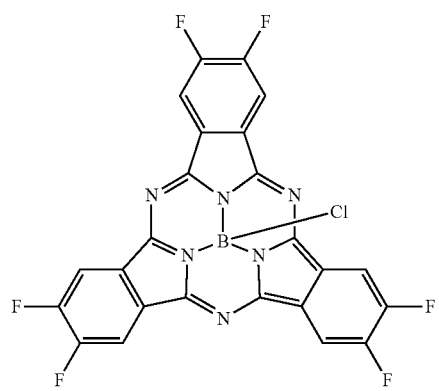
(3-4)
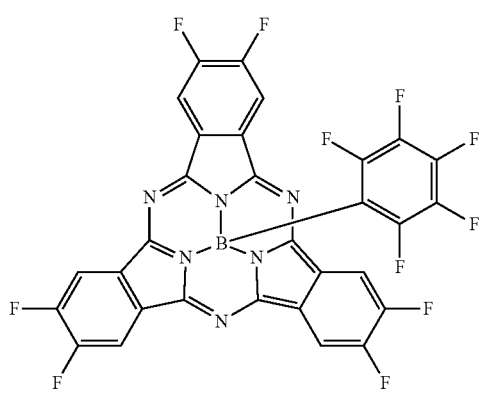
(3-5)
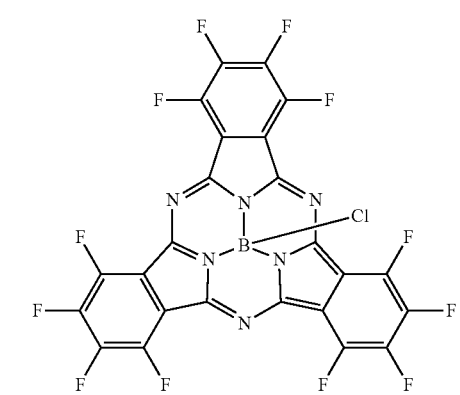
(3-6)
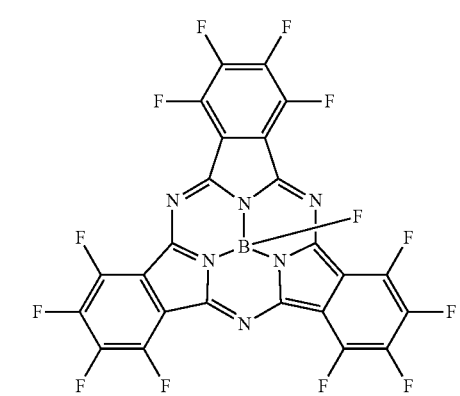
(3-7)
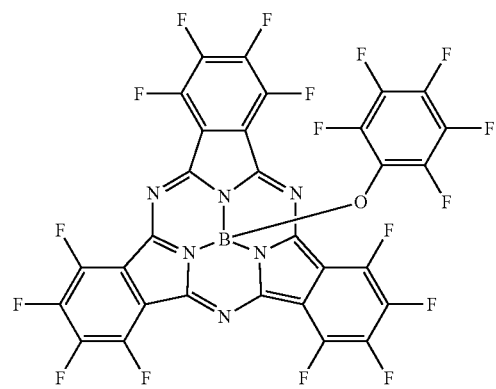
(3-8)
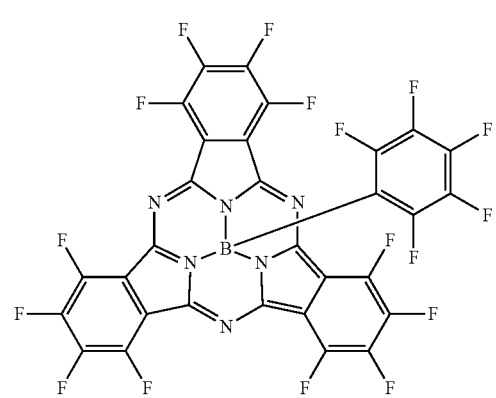
Specific examples of the hexaazatrinaphthylene derivative expressed by the general formula (4) include compounds expressed by the following formulas (4-1) to (4-5), etc.
[Chem. 8]
(4-1)
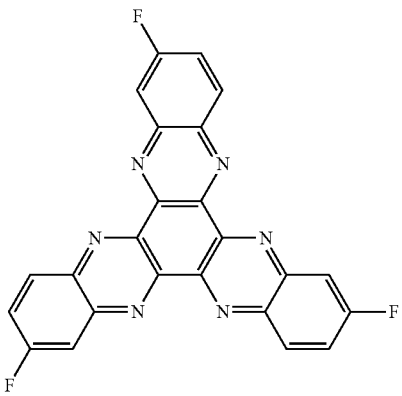

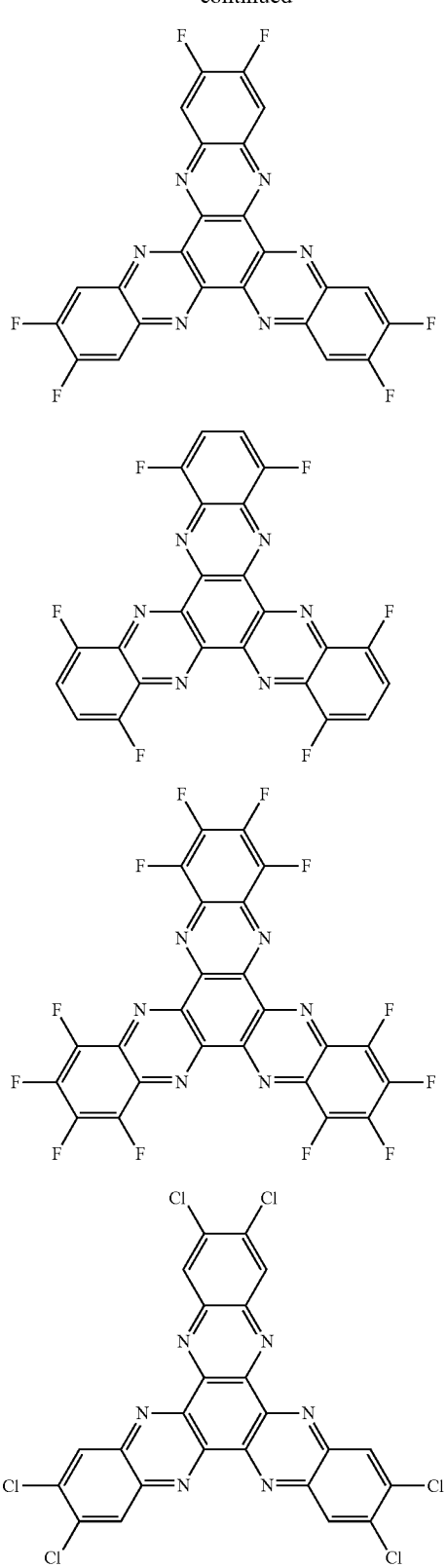

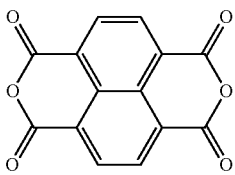

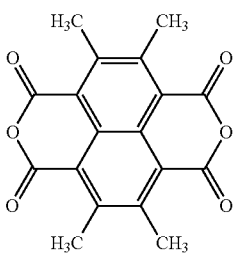

As naphthalenetetracarboxylic dianhydride and the derivative thereof expressed by the general formula (5), compounds expressed by the following formulas (5-1) to (5-2), etc. are adopted. Specific examples of naphthalene diimide and the derivative thereof expressed by the general formula (6) include compounds expressed by the following formulas (6-1) to (6-3), etc.

[Chem.9]

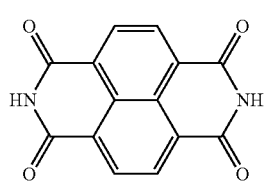

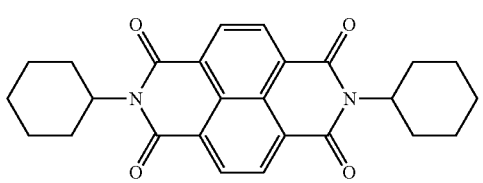

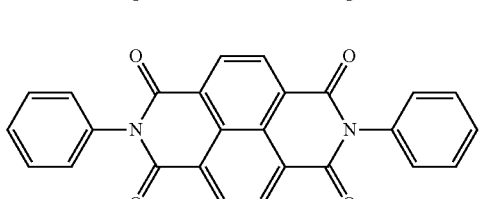

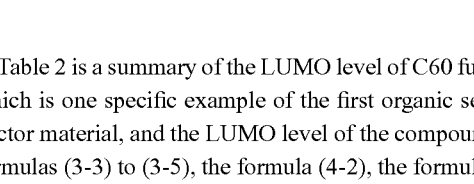

Table 2 is a summary of the LUMO level of C60 fullerene, which is one specific example of the first organic semiconductor material, and the LUMO level of the compounds (the formulas (3-3) to (3-5), the formula (4-2), the formula (4-4), the formula (5-1), and the formula (6-2)) listed as the specific examples of the second organic semiconductor material and the third organic semiconductor material. As described above, it is preferable that the second organic semiconductor material have a deeper LUMO level than the first organic semiconductor material and the third organic semiconductor material, and the foregoing compounds have a deeper LUMO level than C60 fullerene. It is to be noted that the LUMO levels of the foregoing compounds are calculated using a method described in an example to be described later.

TABLE 2

| | LUMO Level (eV) |
|---|---|
| C60 | −4.4 |
| Formula (3-3) | −4.5 |
| Formula (3-4) | −4.5 |
| Formula (3-5) | −4.5 |
| Formula (4-2) | −4.9 |
| Formula (4-4) | −5.3 |
| Formula (5-1) | −4.8 |
| Formula (6-2) | −4.6 |

Table 3 is a summary of electron mobility of the compounds (the formula (3-1), the formula (3-3), the formula (4-2), the formula (4-4), the formula (5-1), and the formula (6-2)) listed as the specific examples of the second organic semiconductor material and the third organic semiconductor material. It is preferable that the second organic semiconductor material have not only higher electron mobility than the first organic semiconductor material but also have higher electron mobility than the third organic semiconductor material. This improves the mobility of electrons resulting from separation of excitons into charges and enhances responsivity of the organic photoelectric converter 20. It is to be noted that electron mobility of the foregoing compounds is calculated using the method described in the example to be described later.

TABLE 3

| | Electron Mobility (cm$^2$/Vs) |
|---|---|
| Formula (3-3) | $<10^{-10}$ |
| Formula (3-1) | $<10^{-10}$ |
| Formula (4-2) | $1 \times 10^{-6}$ |
| Formula (4-4) | $1 \times 10^{-4}$ |
| Formula (5-1) | $1 \times 10^{-4}$ |
| Formula (6-2) | $1 \times 10^{-6}$ |

It is preferable that specific electron mobility of the second organic semiconductor material have a value substantially equal to hole mobility of the foregoing first organic semiconductor material. That is, preferably, the specific electron mobility of the second organic semiconductor material is $10^{-7}$ cm$^2$/Vs or higher, and more preferably $10^{-4}$ cm$^2$/Vs or higher. This achieves balance with hole transport performance ensured by the first organic semiconductor material and enhances responsivity of the organic photoelectric converter 20.

A preferable combination of the organic semiconductor materials expressed by the general formula (3) to the general formula (6) described above, as the second organic semiconductor material and the third semiconductor material, is, for example, as follows. For example, in a case where any of subphthalocyanine and the derivative thereof expressed by the general formula (3) as the third organic semiconductor material is used, a material having a deeper LUMO level than subphthalocyanine and the derivative thereof and having higher electron mobility is selected as the second organic semiconductor material. That is, any of hexaazatrinaphthylene and the derivative thereof, naphthalenetetracarboxylic dianhydride and the derivative thereof, and naphthalene diimide and the derivative thereof expressed by the general formula (4) to the general formula (6) is selected as the second organic semiconductor material.

In addition, it is preferable that the photoelectric conversion layer 22 in the present embodiment contains the foregoing three kinds of organic semiconductor materials in the following ranges. The first organic semiconductor material is preferably contained in a range of 10 volume % or higher and 30 volume % or lower, for example. The second organic semiconductor material is preferably contained in a range of 10 volume % or higher and 60 volume % or lower, for example. The third organic semiconductor material is preferably contained in a range of 25 volume % or higher and 90 volume % or lower, for example.

In a case where the first organic semiconductor material is insufficient, hole transport performance of the photoelectric conversion layer 22 degrades, thereby deteriorating responsivity. In a case where the first organic semiconductor material is excessive, the spectral shape may deteriorate. In a case where the second organic semiconductor material is insufficient, electron transport performance of the photoelectric conversion layer 22 degrades, thereby deteriorating responsivity. In a case where the second organic semiconductor material is excessive, light absorption ability in a visible region may degrade. In addition, the spectral shape may also deteriorate. In a case where the third organic semiconductor material is insufficient, the light absorption ability in the visible region may degrade. In addition, the spectral shape may deteriorate. In a case where the third organic semiconductor material is excessive, hole transport performance and electron transport performance degrade, thereby deteriorating responsivity.

It is to be noted that the photoelectric conversion layer 22 may include other materials as far as the foregoing contents are not disrupted. For example, an organic semiconductor material having the same mother skeleton as any of the first organic semiconductor material, the second organic semiconductor material, and the third organic semiconductor material, and including a different substituent group may be used as a fourth organic semiconductor material.

Other layers may be provided between the photoelectric conversion layer 22 and the lower electrode 21 and between the photoelectric conversion layer 22 and the upper electrode 23. Specifically, for example, an undercoat film, a hole transport layer, an electron blocking film, the photoelectric conversion layer 22, a hole blocking film, a buffer film, an electron transport layer, and a work function adjustment film, etc. may be stacked in sequence from a side on which the lower electrode 21 is located.

The upper electrode 23 includes a conductive film having optical transparency similar to the lower electrode 21. In the solid-state imaging apparatus 1 using the photoelectric conversion element 10A as one pixel, the upper electrode 23 may be separated for each of pixels or formed as a common electrode for the respective pixels. A thickness of the upper electrode 23 is from 10 nm to 200 nm, for example.

The fixed charge layer 24 may be a film having positive fixed charges or a film having negative fixed charges. materials of the film having the negative fixed charges include hafnium oxide, aluminum oxide, zirconium oxide, tantalum oxide, titanium oxide, etc. In addition to the foregoing materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, etc. may also be used.

The fixed charge layer 24 may have a configuration in which two or more kinds of films are stacked. This makes it possible to further enhance a function as a hole accumulation layer, for example, in the case of the film having the negative fixed charges.

Although a material of the dielectric layer 25 is not specifically limited, the dielectric layer 25 is formed using, for example, a silicon oxide film, TEOS, a silicon nitride film, a silicon oxynitride film, etc.

The inter-layer insulation layer 26 includes, for example, a single-layer film including one kind of silicon oxide, silicon nitride, silicon oxynitride (SiON) or the like, or a laminated film including two or more kinds thereof.

The protective layer 27 includes a material having optical transparency, and includes, for example, a single-layer film including any of silicon oxide, silicon nitride, and silicon oxynitride (SiON), or a laminated film including two or more kinds thereof. A thickness of the protective layer 27 is from 100 nm to 30000 nm, for example.

The semiconductor substrate 30 includes a n-type silicon (Si) substrate, for example, and has a p-well 31 in a predetermined region. The vertical type transistor Tr1, the transfer transistor Tr2, the amplifier transistor AMP, and the reset transistor RST, etc., described above are provided on the second surface 30B of the p-well 31. In addition, peripheral circuits (not illustrated) including a logic circuit, etc., are provided in a periphery of the semiconductor substrate 30.

The inorganic photoelectric converters 32B and 32R each have a p/n junction in a predetermined region of the semiconductor substrate 30. The inorganic photoelectric converters 32B and 32R enable dispersion of light in a longitudinal direction with use of a difference in wavelength of absorbed light depending on a depth of light incidence in the silicon substrate. The inorganic photoelectric converter 32B selectively detects blue light to accumulate signal charges corresponding to blue, and is disposed at a depth that allows for efficient photoelectric conversion of blue light. The inorganic photoelectric converter 32R selectively detects red light to accumulate signal charge corresponding to red, and is disposed at a depth that allows for efficient photoelectric conversion of red light. It is to be noted that blue (B) and red (R) are colors respectively corresponding to a wavelength range of 450 nm to 495 nm, for example, and a wavelength range of 620 nm to 750 nm, for example. It is only necessary to allow each of the inorganic photoelectric converters 32B and 32R to detect light in a portion or the entirety of each of the wavelength ranges.

The inorganic photoelectric converter 32B includes a p+ region serving as a hole accumulation layer, and an n region serving as an electron accumulation layer, for example. The inorganic photoelectric converter 32R has a p+ region serving as a hole accumulation layer, and an n region serving as an electron accumulation layer (has a stacking structure of p-n-p), for example. The n region of the inorganic photoelectric converter 32B is coupled to the vertical type transistor Tr1. The p+ region of the inorganic photoelectric converter 32B bends along the vertical type transistor Tr1 and is connected to the p+ region of the inorganic photoelectric converter 32R.

The vertical type transistor Tr1 is a transfer transistor that transfers, to a floating diffusion FD1, signal charges (electrons in the present embodiment) corresponding to blue generated and accumulated in the inorganic photoelectric converter 32B. The inorganic photoelectric converter 32B is formed at a position deep from the second surface 30B of the semiconductor substrate 30; therefore, the transfer transistor of the inorganic photoelectric converter 32B preferably includes the vertical type transistor Tr1.

The transfer transistor Tr2 transfers, to a floating diffusion FD2, signal charges (electrons in the present embodiment) corresponding to red generated and accumulated in the inorganic photoelectric converter 32R, and includes a MOS transistor, for example.

The amplifier transistor AMP is a modulation element that modulates an amount of charges generated in the organic photoelectric converter 20 into voltage, and includes a MOS transistor, for example.

The reset transistor RST resets the charges transferred from the organic photoelectric converter 20 to the floating diffusion FD3, and includes a MOS transistor, for example.

The first lower contact 35, the second lower contact 45, the third lower contact 46, and the upper contact 36 each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

1-2. Method of Manufacturing Photoelectric Conversion Element

It is possible to manufacture the photoelectric conversion element 10A of the present embodiment in the following manner, for example.

Figure 2:
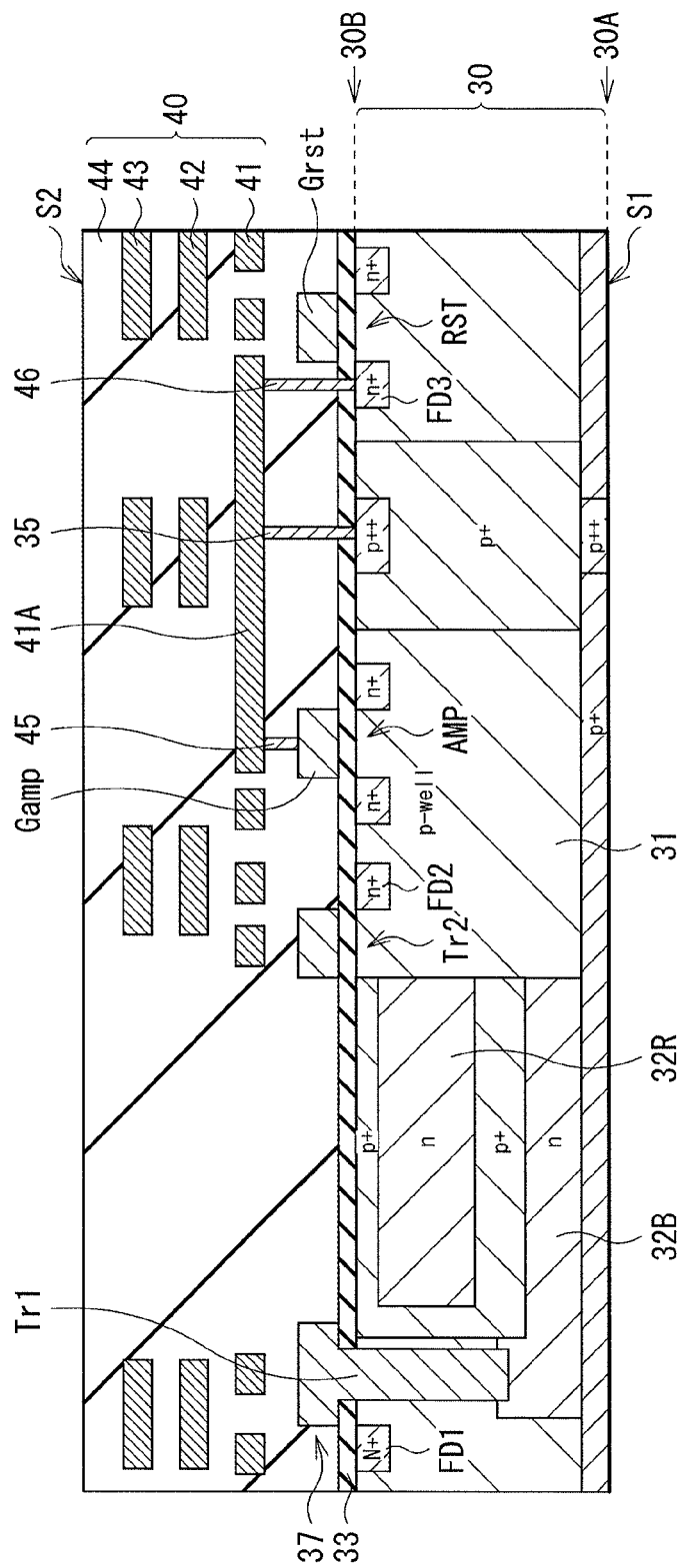
FIG. 2 is a cross-sectional view that describes a method of manufacturing the photoelectric conversion element illustrated in FIG. 1.

FIG. 2 to FIG. 5 illustrate a method of manufacturing the photoelectric conversion element 10A in process order. First, as illustrated in FIG. 2, the p-well 31, for example, is formed as a well of a first conductivity type in the semiconductor substrate 30, and the inorganic photoelectric converters 32B and 32R of a second conductivity type (the n type, for example) are formed in this p-well 31. The p+ region is formed in the vicinity of the first surface 30A of the semiconductor substrate 30.

In addition, also as illustrated in FIG. 2, an impurity region (a p+ region) penetrating from the first surface 30A to the second surface 30B of the semiconductor substrate 30 is formed in a region where the through electrode 34 and the separation groove 50 are to be formed. Furthermore, a high-concentration impurity region (a p++ region) is formed in a region where the upper end and the lower end of the through electrode 34 are to be formed.

As also illustrated in FIG. 2, on the second surface 30B of the semiconductor substrate 30, n+ regions serving as the floating diffusions FD 1 to FD3 are formed, and thereafter, a gate wiring layer 37 including respective gates of a gate insulation layer 33, the vertical type transistor Tr1, the transfer transistor Tr2, the amplifier transistor AMP, and the reset transistor RST is formed. Thus, the vertical type transistor Tr1, the transfer transistor Tr2, the amplifier transistor AMP, and the reset transistor RST are formed. Furthermore, the multilayer wiring 40 including the first lower contact 35, the second lower contact 45, the third lower contact 46, the wiring layers 41 to 43 including the connection unit 41A, and the insulation layer 44 is formed on the second surface 30B of the semiconductor layer 30.

As a base substrate of the semiconductor substrate 30, an SOI (Silicon on Insulator) substrate in which the semiconductor substrate 30, an embedded oxide film (not illustrated), and a retaining substrate (not illustrated) are stacked is used. The embedded oxide film and the retaining substrate are not illustrated in FIG. 2, but are joined to the first surface 30A of the semiconductor substrate 30. Annealing treatment is performed after ion implantation.

Next, a supporting substrate (not illustrated), another semiconductor base substrate, or the like is joined to the side on which the second surface 30B is located of the semiconductor substrate 30 (a side on which the multilayer wiring 40 is located) and flipped from top to bottom. Subsequently, the semiconductor substrate 30 is separated from the embedded oxide film and the retaining substrate of the SOI substrate to cause the first surface 30A of the semiconductor substrate 30 to be exposed. It is possible to perform the above processes with technologies used in a typical CMOS process such as ion implantation and CVD (Chemical Vapor Deposition).

Figure 3:
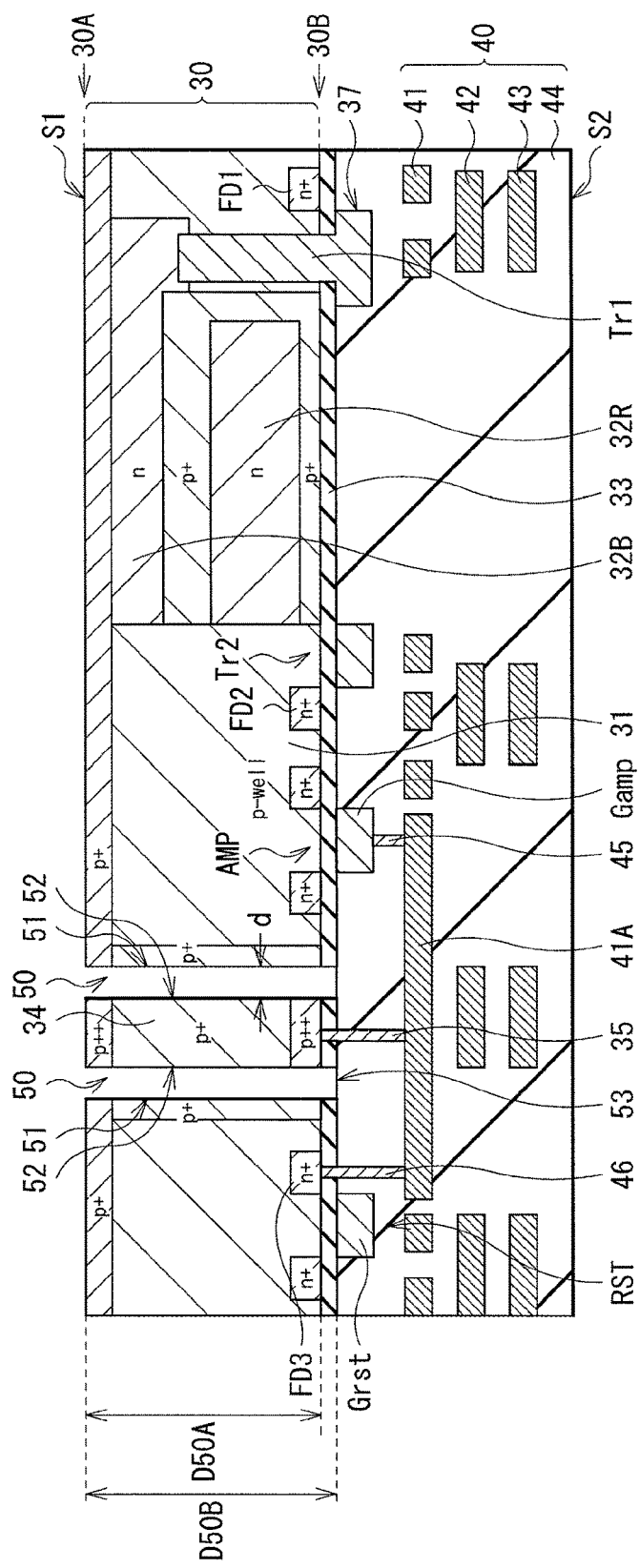
FIG. 3 is a cross-sectional view of a process following FIG. 2.

Next, as illustrated in FIG. 3, the semiconductor substrate 30 is processed from the side on which the first surface 30A is located by dry etching, for example, to form the annular or circular separation groove 50. The depth of the separation groove 50 preferably penetrates from the first surface 30A to the second surface 30B of the semiconductor substrate 30 to reach the gate insulation layer 33, as indicated by an arrow D50A of FIG. 7. Furthermore, to further enhance an insulating effect in the bottom surface 53 of the separation groove 50, the separation groove 50 preferably penetrates through the semiconductor substrate 30 and the gate insulation layer 33 to reach the insulation layer 44 of the multilayer wiring 40, as indicated by an arrow D50B of FIG. 7. FIG. 3 illustrates a case where the separation groove 50 penetrates through the semiconductor substrate 30 and the gate insulation layer 33.

Figure 4:
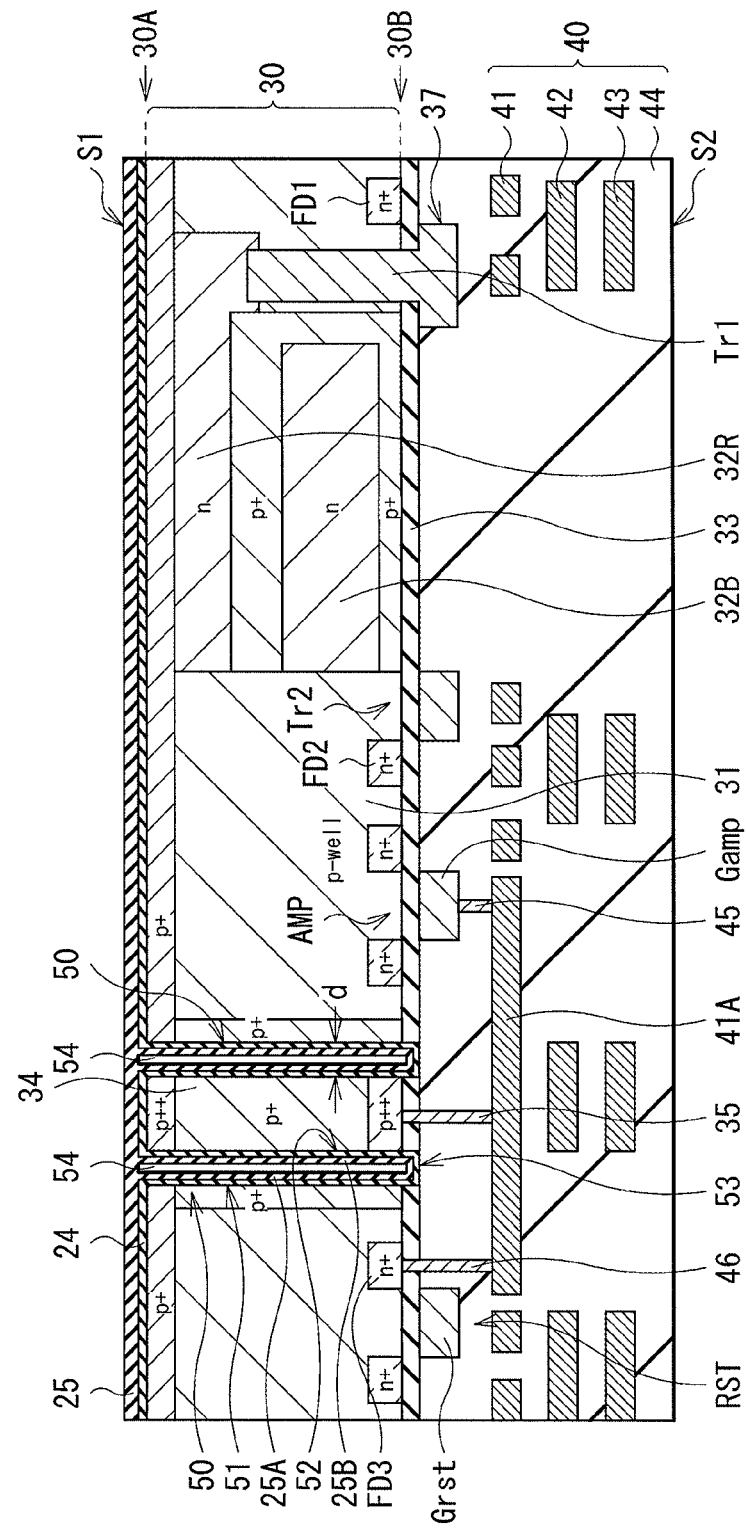
FIG. 4 is a cross-sectional view of a process following FIG. 3.

Subsequently, as illustrated in FIG. 4, for example, the negative fixed charge layer 24 is formed on the outer surface 51, the inner surface 52, and the bottom surface 53 of the separation groove 50 and on the first surface 30A of the semiconductor substrate 30. Two or more kinds of films may be stacked as the negative fixed charge layer 24. This makes it possible to further enhance a function as the hole accumulation layer. After the negative fixed charge layer 24 is formed, the dielectric layer 25 having the outer dielectric layer 25A and the inner dielectric layer 25B is formed. At this time, the cavity 54 is formed between the outer dielectric layer 25A and the inner dielectric layer 25B in the separation groove 50 through appropriately adjusting a film thickness and film formation conditions of the dielectric layer 25.

Figure 5:
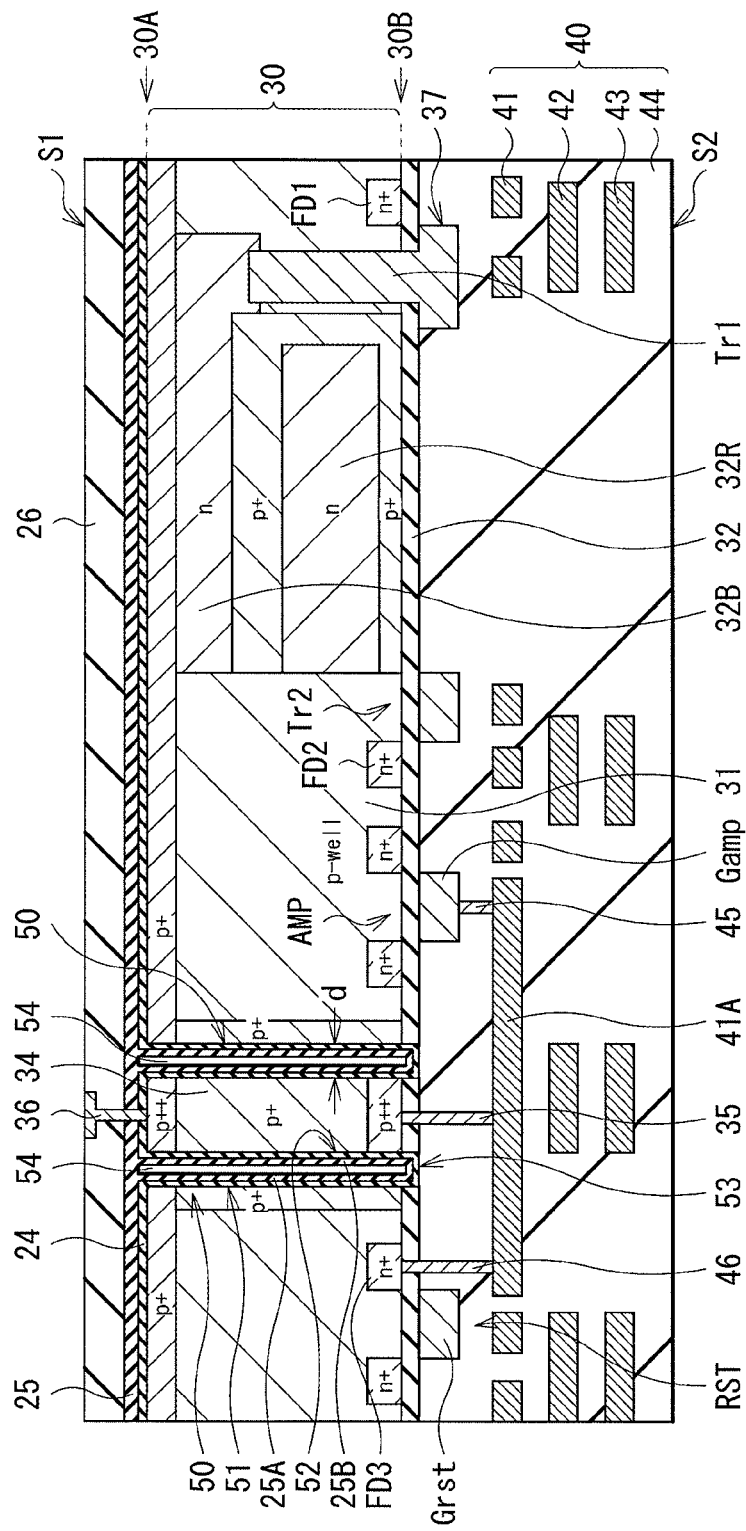
FIG. 5 is a cross-sectional view of a process following FIG. 4.

Next, as illustrated in FIG. 5, the inter-layer insulation layer 26 and the upper contact 36 are formed, and the upper contact 36 is coupled to the top edge of the through electrode 34. Subsequently, the lower electrode 21, the photoelectric conversion layer 22, the upper electrode 23, and the protective layer 27 are formed on the inter-layer insulation layer 26. The photoelectric conversion layer 22 is formed through forming a film of the foregoing three kinds of organic semiconductor materials, for example, with use of a vacuum deposition method, for example. It is to be noted that as described above, in a case where any other organic layer (for example, an electron blocking layer, etc.) is formed above or below the photoelectric conversion layer 22, it is desirable to form the organic layer continuously in a vacuum process (in-situ vacuum process). In addition, the method of forming the photoelectric conversion layer 22 is not necessarily limited to the vacuum deposition method, and other methods such as a spin coat technology or a printing technology may also be used. Lastly, the optical member such as the planarization layer and the on-chip lens (not illustrated) are disposed. Thus, the photoelectric conversion element 10A illustrated in FIG. 1 is completed.

In the photoelectric conversion element 10A, light enters the organic photoelectric converter 20 via the on-chip lens (not illustrated), and thereafter the light passes through the organic photoelectric converter 20 and the inorganic photoelectric converters 32B and 32R in sequence. Each of green light, blue light, and red light is photoelectrically converted in the course of passing. In the following, signal acquisition operations of the respective colors are described.

Acquisition of Green Signal by Organic Photoelectric Converter 20

Of light having entered the photoelectric conversion element 10A, first, green light is selectively detected (absorbed) and photoelectrically converted in the organic photoelectric converter 20.

The organic photoelectric converter 20 is coupled to the gate Gamp of the amplifier transistor AMP and the floating diffusion FD3 via the through electrode 34. Thus, electrons of the electron-hole pairs generated in the organic photoelectric converter 20 are retrieved from the side on which the lower electrode 21 is located, transferred to the side on which the second surface 30B is located of the semiconductor substrate 30 via the through electrode 34, and accumulated in the floating diffusion FD3. Simultaneously with this, the amount of charges generated in the organic photoelectric converter 20 is modulated into voltage by the amplifier transistor AMP.

In addition, the reset gate Grst of the reset transistor RST is disposed adjacent to the floating diffusion FD3. Accordingly, the charges accumulated in the floating diffusion FD3 are reset by the reset transistor RST.

Herein, the organic photoelectric converter 20 is coupled not only to the amplifier transistor AMP but also to the floating diffusion FD3 via the through electrode 34, thus making it possible for the reset transistor RST to easily reset the charges accumulated in the floating diffusion FD3.

In contrast to this, in a case where the through electrode 34 is not coupled to the floating diffusion FD3, it is difficult to reset the charges accumulated in the floating diffusion FD3, causing the charges to be drawn to a side on which the upper electrode 23 is located by application of a large voltage. This may damage the photoelectric conversion layer 22. In addition, a configuration that enables resetting in a short period of time causes an increase in dark time noise, thereby resulting in a trade-off; therefore, this configuration is difficult.

Acquisition of Blue Signal and Red Signal by Inorganic Photoelectric Converters 32B and 32R Subsequently, blue light and red light of the light having passed through the organic photoelectric converter 20 are absorbed and photoelectrically converted in sequence respectively in the inorganic photoelectric converter 32B and the inorganic photoelectric converter 32R. In the inorganic photoelectric converter 32B, electrons corresponding to the incident blue light are accumulated in the n region of the inorganic photoelectric converter 32B, and the accumulated electrons are transferred to the floating diffusion FD1 by the vertical type transistor Tr1. Similarly, in the inorganic photoelectric converter 32R, electrons corresponding to the incident red light are accumulated in the n region of the inorganic photoelectric converter 32R, and the accumulated electrons are transferred to the floating diffusion FD2 by the transfer transistor Tr2.

1-3. Workings and Effects

As described above, in recent years, in a solid-state imaging apparatus such as a CCD image sensor or a CMOS image sensor, high color reproducibility, a high frame rate, and high sensitivity have been in demand. To achieve them, an excellent spectral shape, high responsivity, and high external quantum efficiency (EQE) are in demand.

In an imaging element that extracts signals of two colors through the Si bulk spectroscopy described above, and extracts a signal of one color in the organic photoelectric conversion film provided on a Si bulk, generally, the organic photoelectric conversion film has a bulk hetero structure including an p-type organic semiconductor material and an n-type organic semiconductor material. The bulk hetero structure increases a charge-separated interface and enhances conversion efficiency by co-evaporating the p-type organic semiconductor material and the n-type organic semiconductor material. Thus, in a typical general solid-state imaging apparatus, the spectral shape, responsivity, and EQE of the organic photoelectric conversion film are enhanced with use of two kinds of materials. Specifically, for example, a combination such as a combination of fullerenes and quinacridones, or a combination of subphthalocyanines, quinacridones, and subphthalocyanines is used.

To enhance responsivity and EQE, it is desirable that mobility of carriers (electrons and holes) of the organic photoelectric conversion film be high. In the organic photoelectric conversion film including the two kinds of materials, one material functions as the n-type semiconductor that transports electrons, for example, and the other material functions as the p-type semiconductor that transports holes, for example. Furthermore, either of them serves as a color material absorbing a wavelength in the visible region, for example. In the organic photoelectric conversion film including fullerenes and quinacridones, for example, the fullerenes function as the n-type semiconductor that transports electrons, and the quinacridones function as the p-type semiconductor that transports holes and acts as the color material. In general, however, the organic semiconductor material usable as the color material has low carrier mobility. Hence, it is difficult to obtain sufficient responsivity and sufficient EQE.

In addition, the imaging element is conceivable that uses the three kinds of the organic semiconductor materials each being responsible for any of transport of carriers (electrons and holes) and absorption of light in a predetermined wavelength range. In the imaging element using fullerene as one kind of the three kinds of organic semiconductor materials, fullerene has high electron mobility and is therefore generally used as the n-type semiconductor material. However, it is difficult to obtain an organic semiconductor material having hole mobility substantially equal to electron mobility of fullerene. Thus, the hole mobility is rate-limiting in order to obtain high responsivity and high EQE in the solid-state imaging apparatus provided with the organic photoelectric conversion film including the three kinds of organic semiconductor materials.

In contrast to this, in the present embodiment, the photoelectric conversion layer 22 is formed using the three kinds of organic semiconductor materials, and fullerene or the derivative thereof is used as the first organic semiconductor material of the three kinds of the organic semiconductor materials, and the organic semiconductor material having a deeper HOMO level than fullerene or the derivative thereof (the first semiconductor material) is used as the second organic semiconductor material. This makes it possible to use fullerene or the derivative thereof as the p-type semiconductor, and utilize high hole mobility that fullerene or derivative thereof has. Moreover, in the present embodiment, the organic semiconductor material in the form of a single-layer film having a higher linear absorption coefficient of the maximal absorption wavelength in the visible region than the single-layer film of the first organic semiconductor material and the single-layer film of the second organic semiconductor material is used. This makes it possible to maintain a sharp spectral shape. Therefore, it is possible to enhance hole mobility and electron mobility in the photoelectric conversion layer 22 without sacrificing the spectral shape. It is also possible to enhance charge transport efficiency after excitons generated by light absorption are dissociated into the charges.

As described heretofore, in the present embodiment, the photoelectric conversion layer 22 is provided that uses fullerene or the derivative thereof (the first organic semiconductor material), the second organic semiconductor material having a deeper HOMO level than fullerene or the derivative thereof, and the third organic semiconductor material having, in the form of the single-layer film, a higher linear absorption coefficient of the maximal absorption wavelength in the visible region than the single-layer film of the first organic semiconductor material and the single-layer film of the second organic semiconductor material. Therefore, a sharp spectral shape, high charge mobility, and high charge transport efficiency are obtained, thus making it possible to achieve an excellent spectral shape, high responsivity, and high EQE.

Next, a second embodiment is described. In the following, same components as those of the foregoing first embodiment are denoted by same reference numerals, and description thereof is omitted where appropriate.

2. Second Embodiment

Figure 6:
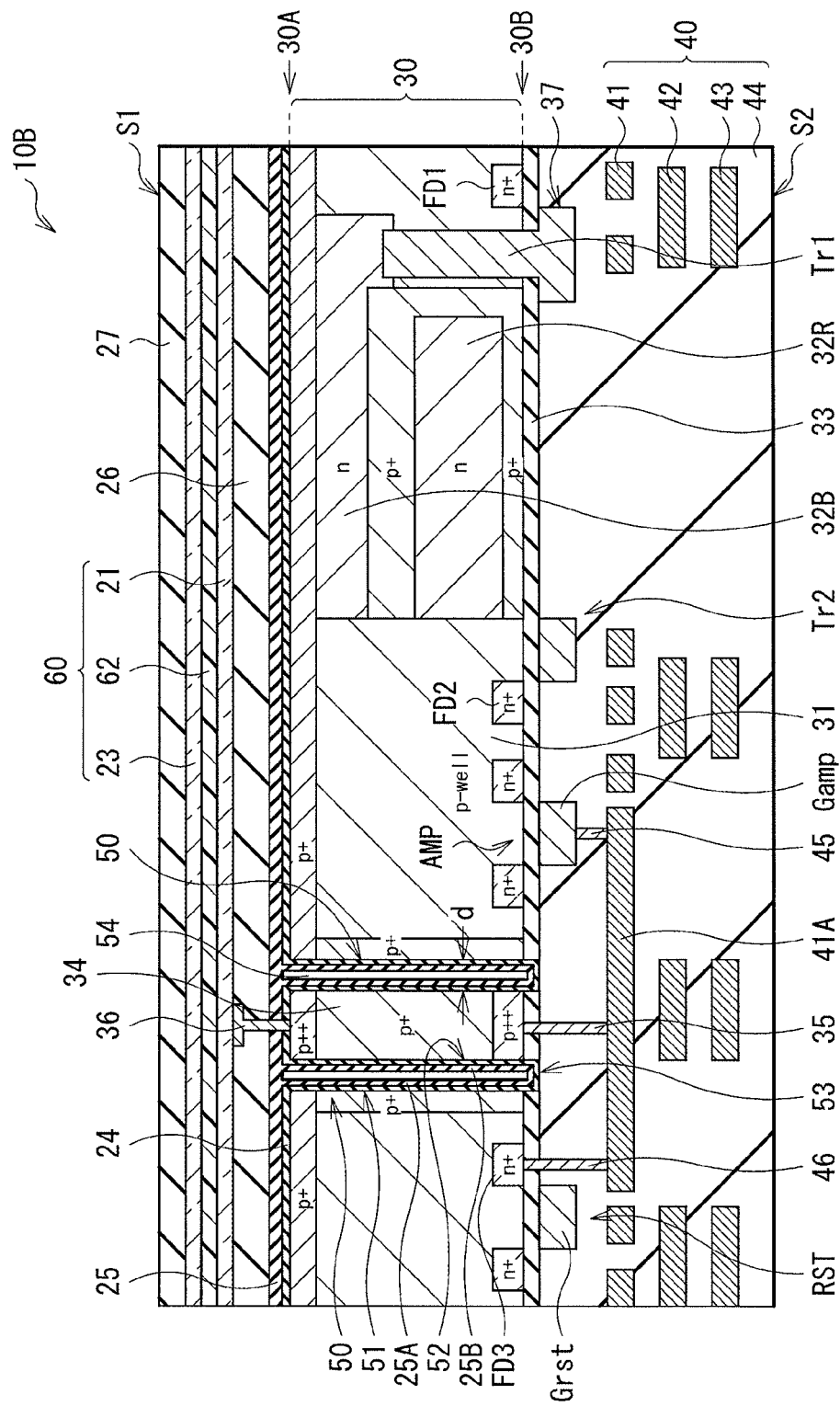
FIG. 6 is a cross-sectional view of an example of a schematic configuration of a photoelectric conversion element according to a second embodiment of the present disclosure.

FIG. 6 schematically illustrates a cross-sectional configuration of a photoelectric conversion element (a photoelectric conversion element 10B) of a second embodiment of the present disclosure. The photoelectric conversion element 10B is of a so-called longitudinal spectral type in which one organic photoelectric converter 60 and two inorganic photoelectric converters 32B and 32R are stacked in the longitudinal direction. The photoelectric conversion element 10B of the present embodiment differs from the foregoing first embodiment in that a photoelectric conversion layer 62 includes two kinds of organic semiconductor materials (the first organic semiconductor material and the second organic semiconductor material) that have mutually different mother skeletons. In the photoelectric conversion element 10B, the light entering the organic photoelectric converter 60 is absorbed by the second organic semiconductor material of the photoelectric conversion layer 62, and excitons generated thereby are dissociated at an interface between the first organic semiconductor material and the second organic semiconductor material.

The first organic semiconductor material is preferably a material functioning as a p-type semiconductor and having a high hole transporting property. Specifically, the material is C60 fullerene or the derivative thereof expressed by the foregoing general formula (1) or C70 fullerene or the derivative thereof expressed by the foregoing general formula (2).

The second organic semiconductor material functions as an n-type semiconductor and has a deeper HOMO level than the first organic semiconductor material. Furthermore, in the present embodiment, it is preferable that the second organic semiconductor material in a form of a single-layer film have a higher linear absorption coefficient of the maximal absorption wavelength in the visible region (for example, from 450 nm to 800 nm) than a single-layer film of the first organic semiconductor material. This makes it possible to form the photoelectric conversion layer 62 having high charge mobility and high charge transport efficiency by the two kinds of materials (the first organic semiconductor material and the second organic semiconductor material). Note that the second organic semiconductor material preferably has a sharp spectral shape in a selective wavelength range (for example, from 450 nm to 650 nm). This makes it possible to obtain an excellent spectral shape.

Examples of the second organic semiconductor material include subphthalocyanine and the derivative thereof expressed by the foregoing general formula (3).

It is preferable that the photoelectric conversion layer 62 in the present embodiment contain the first organic semiconductor material and the second organic semiconductor material in the following ranges. The first organic semiconductor material is preferably contained in a range of 10 volume % or higher and 35 volume % or lower, for example. The second organic semiconductor material is preferably contained in a range of 65 volume % or higher and 90 volume % or lower, for example.

In a case where the first organic semiconductor material is insufficient, hole transport performance of the photoelectric conversion layer 62 degrades, thereby deteriorating responsivity. In a case where the first organic semiconductor material is excessive, the spectral shape may deteriorate. In a case where the second organic semiconductor material is insufficient, light absorption ability in the visible region may degrade. Moreover, the spectral shape may deteriorate. In a case where the second organic semiconductor material is excessive, hole transport performance degrades, thereby deteriorating responsivity.

It is to be noted that the photoelectric conversion layer 62 may include other materials as far as the foregoing contents are not disrupted. For example, an organic semiconductor material having the same mother skeleton as any of the first organic semiconductor material and the second organic semiconductor material and having a different substituent group may be used as the fourth organic semiconductor material.

As described heretofore, in the present embodiment, the photoelectric conversion layer 62 is configured with use of the two kinds of organic semiconductor materials (the first organic semiconductor material and the second organic semiconductor material). Fullerene or the derivative thereof is used as the first organic semiconductor material, and the organic semiconductor material having a deeper HOMO level than the first organic semiconductor material, and having, in the form of a single-layer film, a higher linear absorption coefficient of the maximal absorption wavelength in the visible region, is used as the second organic semiconductor material. This makes it possible to achieve an excellent spectral shape, high responsivity, and high EQE, and provide the photoelectric conversion element provided with the photoelectric conversion layer 62 including the two kinds of organic semiconductor materials.

2. Application Example

Application Example 1

Figure 7:
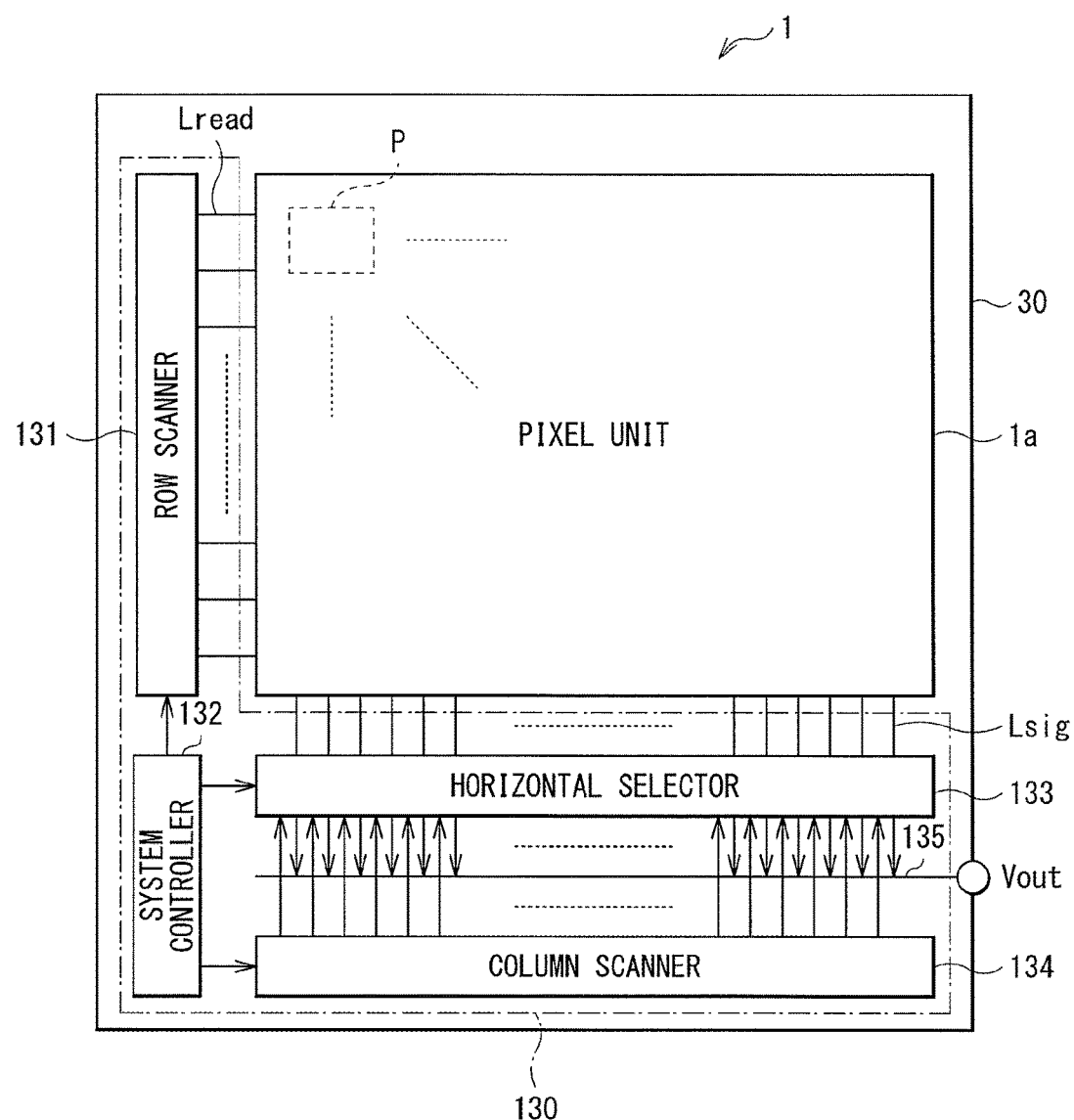
FIG. 7 is a block diagram illustrating a configuration of a solid-state imaging apparatus that uses the photoelectric conversion element illustrated in FIG. 1 or FIG. 6 as a pixel.

FIG. 7 illustrates an overall configuration of a solid-state imaging apparatus (the solid-state imaging apparatus 1) using, for each of the pixels, the photoelectric conversion element 10A (or the photoelectric conversion element 10B) described in the foregoing first embodiment (or the second embodiment). The solid-state imaging apparatus 1 is a CMOS image sensor, and includes, on the semiconductor substrate 30, a pixel unit 1a as an imaging region and a peripheral circuit unit 130 including, for example, a row scanner 131, a horizontal selector 133, a column scanner 134, and a system controller 132 in a peripheral region of the pixel unit 1a.

The pixel unit 1a has a plurality of unit pixels P (each corresponding to the photoelectric conversion element 10A) two-dimensionally arranged in a matrix, for example. The unit pixels P are wired with pixel drive lines Lread (specifically, row selection lines and reset control lines) for respective pixel rows, and vertical signal lines Lsig for respective pixel columns, for example. The pixel drive lines Lread transmit drive signals for signal reading from the pixels. The pixel driving lines Lread each have one end coupled to a corresponding one of output terminals, corresponding to the respective rows, of the row scanner 131.

The row scanner 131 includes a shift register, an address decoder, etc. and is a pixel driver, for example, that drives the respective pixels P in the pixel unit 1a on a row-by-row basis. A signal outputted from each of the pixels P of a pixel row selectively scanned by the row scanner 131 is supplied to the horizontal selector 133 through each of the vertical signal lines Lsig. The horizontal selector 133 includes an amplifier, a horizontal selection switch, etc. provided for each of the vertical signal lines Lsig.

The column scanner 134 includes a shift register, an address decoder, etc., and drives horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control IC. Alternatively, the circuit components may be formed by any other substrate coupled by a cable, etc.

The system controller 132 receives a clock given from the outside of the semiconductor substrate 30 or data etc. on instructions of operation modes to command an operation mode, and also outputs data such as internal information of the solid-state imaging apparatus 1. The system controller 132 further has a timing generator that generates various timing signals, and performs drive control of the peripheral circuits such as the row scanner 131, the horizontal selector 133, and the column scanner 134, on the basis of the various timing signals generated by the timing generator.

Application Example 2

Figure 8:
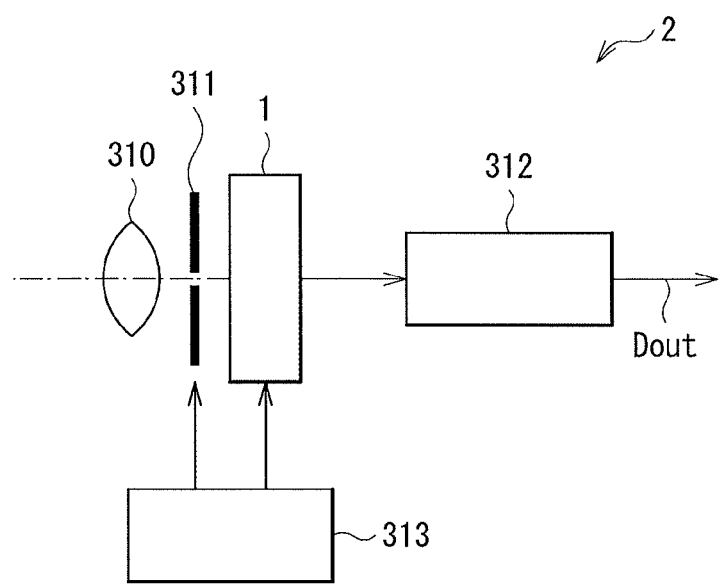
FIG. 8 is a functional block diagram illustrating an example of an electronic apparatus (camera) using the solid-state imaging apparatus illustrated in FIG. 7.

The foregoing solid-state imaging apparatus 1 is applicable to various kinds of electronic apparatuses having imaging functions. Examples of the electronic apparatuses include camera systems such as digital still cameras and video cameras and mobile phones having the imaging functions. FIG. 8 illustrates, for purpose of an example, a schematic configuration of the electronic apparatus 2 (a camera). The electronic apparatus 2 is a video camera that enables shooting of a still image or a moving image, for example, and includes the solid-state imaging apparatus 1, an optical system (an optical lens) 310, a shutter apparatus 311, a driver 313 that drives the solid-state imaging apparatus 1 and the shutter apparatus 311, and a signal processor 312.

The optical system 310 guides image light (incident light) from an object to the pixel unit 1a of the solid-state imaging apparatus 1. The optical system 310 may include a plurality of optical lenses. The shutter apparatus 311 controls a period in which the solid-state imaging apparatus 1 is irradiated with the light and a period in which the light is blocked. The driver 313 controls a transfer operation of the solid-state imaging apparatus 1 and a shutter operation of the shutter apparatus 311. The signal processor 312 performs various types of signal processing on signals outputted from the solid-state imaging apparatus 1. An image signal Dout having been subjected to the signal processing is stored in a storage medium such as a memory or outputted to a monitor, etc.

The foregoing solid-state imaging apparatus 1 is also applicable to the following electronic apparatuses (a capsule endoscope 10100 and a mobile body of a vehicle, etc.)

Application Example 3

Application Example to In-vivo Information Acquisition System

Figure 9:
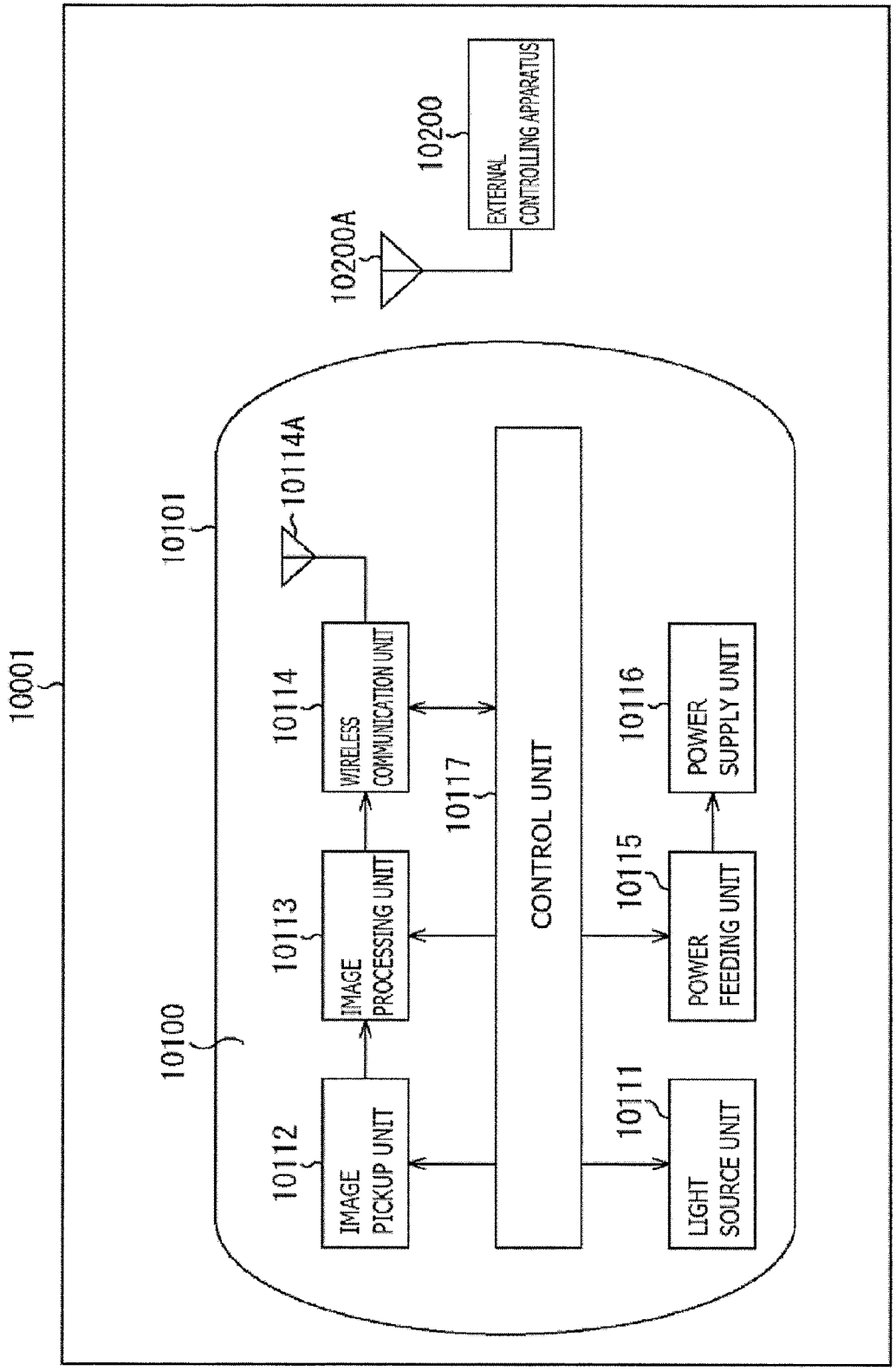
FIG. 9 is a block diagram depicting an example of a schematic configuration of an in-vivo information acquisition system.

FIG. 9 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 9, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to the present disclosure can be applied. The technology according to the present disclosure is applicable to, for example, the image pickup unit 10112 of the configurations described above. This makes it possible to acquire a fine operative image having higher color reproducibility, thereby improving accuracy of an inspection.

Application Example 4

Application Example to Mobile Body

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, bicycle, a personal mobility, an airplane, an unmanned aerial vehicle, a vessel, and a robot.

Figure 10:
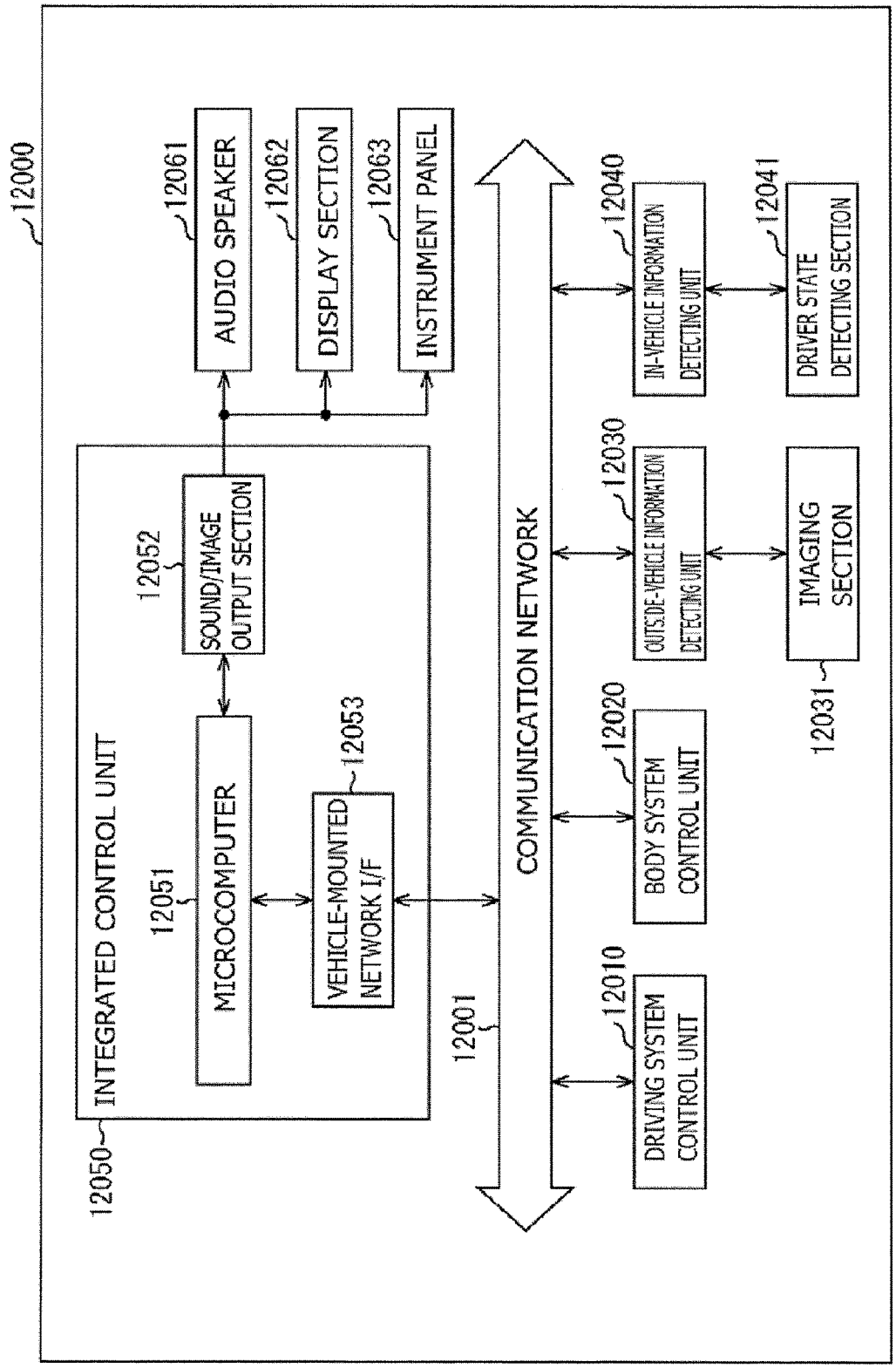
FIG. 10 is a block diagram depicting an example of schematic configuration of a vehicle control system.

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

Figure 11:
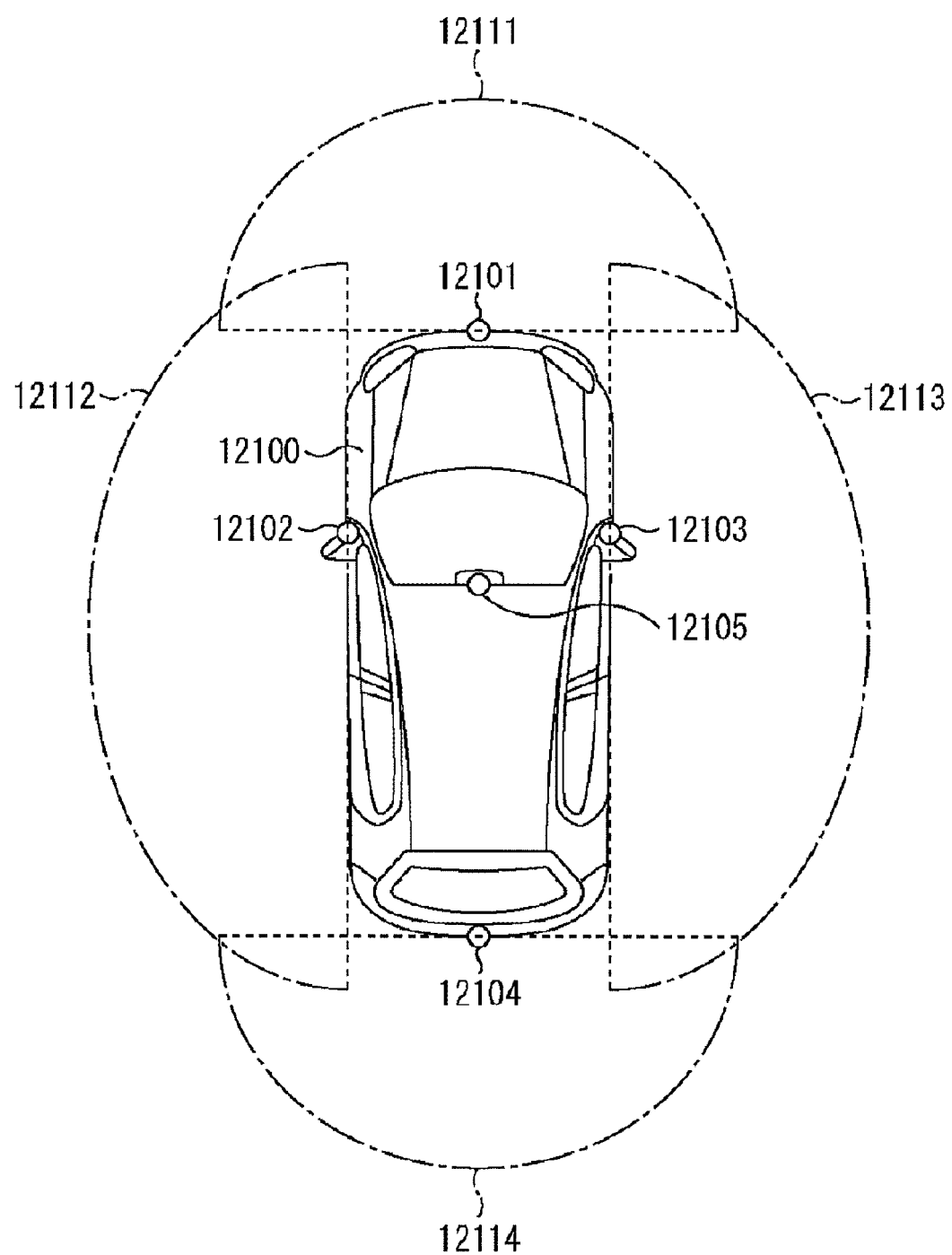
FIG. 11 is a diagram of assistance in explaining an example of an installation position of an imaging section.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

4. Examples

In the following, various types of samples (experimental examples 1 to 18, etc., for example) according to the first embodiment and the second embodiment of the present disclosure were fabricated to evaluate the spectral characteristics, the LUMO level, the electron mobility, the external quantum efficiency (EQE), and the responsivity thereof.

Experiment 1: Calculation of LUMO Level

The LUMO level of the respective organic semiconductor materials listed in Table 2 were calculated using the following method. First, a single-layer film of the subphthalocyanine derivative expressed by the formula (3-3), for example, was formed by a resistance heating method on a glass substrate cleaned by UV/ozone processing, with use of an organic evaporation apparatus while turning a substrate holder in a vacuum of $1 \times 10^{-5}$ Pa or lower. An evaporation speed was 0.1 nm/second, and a thickness of the film was 50 nm. Subsequently, a film of ITO having a film thickness of 50 nm was formed by a sputtering method so as to cover the single-layer film of the subphthalocyanine derivative, and a resultant was a sample for the evaluation of the spectral characteristics. Furthermore, in addition to the subphthalocyanine derivative expressed by the formula (3-3), a single-layer film of each of the organic semiconductor materials expressed by the formula (3-4), the formula (3-5), the formula (4-2), the formula (4-4), the formula (5-1), and the formula (6-2), and C60 fullerene was also formed by a method similar to the above-described method to evaluate the spectral characteristics thereof.

The spectral characteristics were evaluated as follows, for example. First, transmittance and a reflectance for each wavelength were measured with use of an UV-visible spectrophotometer to determine light absorptivity (%) of light absorbed by each of the single-layer films. A linear absorption coefficient $\alpha$ ($cm^{-1}$) for each wavelength in each of the single-layer films was determined from the Lambert-Beer law with use of the light absorptivity and the film thickness of the single-layer film as parameters.

Subsequently, the LUMO level of each of the organic semiconductor materials was calculated. First, a single-layer film of each of the organic semiconductor materials expressed by the formula (3-3), the formula (3-4), the formula (3-5), the formula (4-2), the formula (4-4), the formula (5-1), and the formula (6-2), and C60 fullerene was fabricated with use of a method similar to the above-described method. It is to be noted that a film thickness of each of the single-layer films was 20 nm. Then, the HOMO level was measured as follows. First, ultraviolet light of 21.2 eV was applied to the single-layer film of the subphthalocyanine derivative expressed by the formula (3-3), for example, to acquire a kinetic energy distribution of electrons outputted from a surface of the single-layer film. A value obtained by subtracting an energy width of an obtained spectrum from an energy value of the applied ultraviolet light was a HOMO level.

Subsequently, a maximal absorption wavelength obtained from the measurement result of the linear absorption coefficient for each wavelength measured in the foregoing evaluation of the spectral characteristics was converted into an energy unit. The energy thus obtained was added to the HOMO level to obtain the LUMO level of the subphthalocyanine derivative expressed by the formula (3-3), for example. LUMO levels of the formula (3-4), the formula (3-5), the formula (4-2), the formula (4-4), the formula (5-1), the formula (6-2), and C60 fullerene were also calculated with use of a method similar to the above-described method.

Experiment 2: Evaluation of Electron Mobility

The electron mobility of each of the organic semiconductor materials listed in Table 3 was evaluated with use of the following method. First, a glass substrate provided with an AlSiC electrode with a thickness of 50 nm was cleaned by $Ar/O_2$ plasma processing. Then, a film of LiF having a total thickness of 0.5 nm was formed on the glass substrate. Subsequently, a single-layer film of the subphthalocyanine derivative expressed by the formula (3-1), for example, was formed by a resistance heating method with use of an organic evaporation apparatus while turning a substrate holder in a vacuum of $1 \times 10^{-5}$ Pa or lower. The evaporation speed was 0.1 nm/second, and a thickness of the film was 100 nm. Then, after a film of LiF having a total thickness of 0.5 nm was formed on the glass substrate, an AlSiCu film having a film thickness of 100 nm was formed so as to cover the single-layer film of the subphthalocyanine derivative expressed by the formula (3-1) to fabricate a photoelectric conversion element having a photoelectric conversion region of 1 mm×1 mm.

The electron mobility was evaluated with use of a semiconductor parameter analyzer. Specifically, a bias voltage applied between electrodes was swept from 0 V to −5 V to obtain a current-voltage curve. A relational expression between mobility and voltage was determined by fitting the curve in accordance with a space-charge limited current model to obtain a value of the electron mobility at 1 V. In each of the organic semiconductor materials expressed by the formula (3-3), the formula (4-2), the formula (4-4), the formula (5-1), and the formula (6-2), the value of the electron mobility at 1 V was obtained with use of a method similar to the above-described method.

Experiment 3: Evaluation of Spectral Characteristics, External Quantum Efficiency, and Responsivity Experimental examples 3 to 13 as examples were fabricated with use of the following method to evaluate the spectral characteristics, the external quantum efficiency, and the responsivity thereof. First, a glass substrate provided with an ITO electrode having a film thickness of 50 nm was cleaned by UV/ozone processing. Then, an organic film (a photoelectric conversion film) having a total thickness of 100 nm was formed by a resistance heating method with use of an organic evaporation apparatus while turning a substrate holder in vacuum of 1×10 Pa or lower. In a case where three kinds of organic semiconductor materials were used as evaporation sources (corresponding to the first embodiment), as evaporation conditions, respective evaporation speeds were 0.050 nm/second (the first organic semiconductor material), 0.075 nm/second (the second organic semiconductor material), and 0.75 nm/second (the third organic semiconductor material). In a case where two kinds of organic semiconductor materials were used as evaporation sources (corresponding to the second embodiment), respective evaporation speeds were 0.020 nm/second (the first organic semiconductor material) and 0.080 nm/second (the second organic semiconductor material). Subsequently, a film of ITO having a film thickness of 50 nm was formed on a photoelectric conversion layer by a sputtering method to fabricate the sample for evaluation of the spectral characteristics. In addition, a film of AlSiCu having a film thickness of 100 nm serving as an upper electrode was formed on the photoelectric conversion layer by an evaporation method to fabricate a photoelectric conversion element having a photoelectric conversion region of 1 mm×1 mm.

Furthermore, samples for evaluation of the spectral characteristics and photoelectric conversion elements of experimental examples 1 and 2 as comparative examples were fabricated with use of a method similar to the above-described method. It is to be noted that in the experimental example 1, two kinds, i.e., the formula (3-1) and BQD expressed in the following formula (7-1) were used as the organic semiconductor materials, and respective evaporation speeds were 0.075 nm/second (BQD) and 0.075 nm/second (the formula (3-1)). In the experimental example 2, the three kinds, i.e., MMQD expressed in the following formula (7-2), the formula (3-1), and BQD expressed by the formula (7-1) were used as the organic semiconductor materials, and respective evaporation speeds were 0.025 nm/second (MMQD), 0025 nm/second (BQD)), and 0.050 nm/second (formula (3-3)).

[Chem. 10]

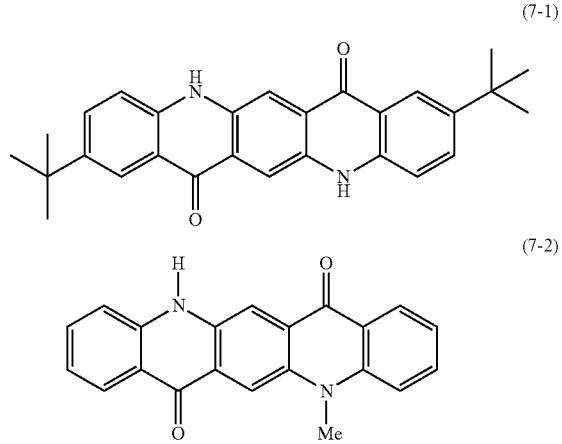

For the experimental examples 1 to 13, the spectral characteristics, the external quantum efficiency, and the responsivity thereof were evaluated as follows. Table 4 is a summary of combinations of the organic semiconductor materials that configure the photoelectric conversion layers of the experimental examples 1 to 13, and evaluation results of the spectral characteristics, the external quantum efficiency, and the responsivity. It is to be noted that values related to EQE and response speed listed in Table 4 are relative values in a case where the experimental example 2 is a reference.

Evaluation Method of Spectral Characteristics

The spectral characteristics were evaluated using a UV-visible spectrophotometer. The transmittance and the reflectance for each wavelength were measured to determine light absorptivity (%) absorbed in an organic layer. A linear absorption coefficient α ($cm^{-1}$) for each wavelength in the organic layer was devaluated from the Lambert-Beer law with use of the light absorptivity and a thickness of the organic layer as parameters. Wavelengths at two points at which relative intensity was one-third of a peak value in an absorption band seen in the visible light region were determined to calculate a spacing between these two points. As an indication of propriety of the spectral shape, a case where the spacing between the two points was 115 nm or smaller was judged as A and a case where the spacing was larger than 115 nm was judged as B. In addition, a case where a maximum linear absorption coefficient of the absorption band seen in the visible light region was 80000 $cm^{-1}$ or lower was judged as B, because an absorption amount of the film was insufficient.

Evaluation Method of External Quantum Efficiency

The external quantum efficiency was evaluated using a semiconductor parameter analyzer. Specifically, the external quantum efficiency was calculated from a light current value and a dark current value in a case where an amount of light applied from a light source to the photoelectric conversion element via a filter was 1.62 $\mu W/cm^2$ and a bias voltage applied between electrodes was −1 V.

Evaluation Method of Responsivity

The responsivity was evaluated through measuring speed of falling a light current value observed during light irradiation using a semiconductor parameter analyzer after light irradiation was stopped. Specifically, a light amount of light applied from a light source to the photoelectric conversion element via a filter was 1.62 $\mu W/cm^2$, and a bias voltage applied between electrodes was −1 V. After a steady current was observed in this state, light irradiation was stopped to observe how the current attenuated. Subsequently, a dark current value was subtracted from an obtained current-time curve. With use of the current-time curve thereby obtained, time necessary for a current value after the light irradiation was stopped to attenuate to 3% of a current value observed in a steady state was used as an index of the responsivity.

TABLE 4

| | First Organic Semiconductor Material | Second Organic Semiconductor Material | Third Organic Semiconductor Material | EQE | Response Speed | Spectral Shape |
|---|---|---|---|---|---|---|
| Experimental example 1 | BQD | Formula (3-1) | — | 1 | 3 | A |
| Experimental example 2 | MMQD | BQD | Formula (3-1) | 1 | 1 | A |
| Experimental example 3 | C60 | Formula (4-2) | Formula (3-1) | 1.02 | 0.5 | A |
| Experimental example 4 | C60 | Formula (4-4) | Formula (3-1) | 1.03 | 0.4 | A |
| Experimental example 5 | C60 | Formula (5-1) | Formula (3-1) | 1.05 | 0.3 | A |
| Experimental example 6 | C60 | Formula (6-2) | Formula (3-1) | 1.04 | 0.3 | A |
| Experimental example 7 | C60 | Formula (4-2) | Formula (3-3) | 1.02 | 0.6 | A |
| Experimental example 8 | C60 | Formula (3-1) | — | 1.01 | 0.9 | A |

TABLE 4-continued

| | First Organic Semiconductor Material | Second Organic Semiconductor Material | Third Organic Semiconductor Material | EQE | Response Speed | Spectral Shape |
|---|---|---|---|---|---|---|
| Experimental example 9 | C60 | Formula (4-2) | Formula (3-4) | 1.02 | 0.6 | A |
| Experimental example 10 | C60 | Formula (4-4) | Formula (3-4) | 1.03 | 0.5 | A |
| Experimental example 11 | C60 | Formula (5-1) | Formula (3-4) | 1.02 | 0.4 | A |
| Experimental example 12 | C60 | Formula (6-2) | Formula (3-4) | 1.04 | 0.4 | A |
| Experimental example 13 | C60 | Formula (3-1) | — | 1.04 | 0.95 | A |

As can be seen from Table 4, in comparison with the experimental examples 1 and 2, both the EQE and the responsivity were enhanced in the experimental examples 3 to 13 corresponding to the examples of the present disclosure. That is, it was found that it was possible to enhance the response speed without sacrificing the spectral shape and the EQE through forming the photoelectric conversion layer using C60 fullerene, the second organic semiconductor material of which the electron mobility in a form of a single-layer film was higher than the electron mobility in a form of a single-layer film of C60 fullerene, and the third semiconductor organic material in a form of a single-layer film having a higher linear absorption coefficient of a maximal absorption wavelength in the visible region than the single-layer film of C60 fullerene and the single-layer film of the second organic semiconductor material, or using C60 fullerene and the second organic semiconductor material having a deeper HOMO level than C60 fullerene and having a high linear absorption coefficient of a maximal absorption wavelength in the visible region.

Experiment 4: Composition Ratio of Photoelectric Conversion Layer

Photoelectric conversion elements (experimental examples 14 to 18), as samples were fabricated with use of a method similar to the foregoing experiment 3, except that a composition ratio of the photoelectric conversion layer was changed. It is to be noted that the composition ratio of the photoelectric conversion layer was controlled by evaporation speed of each material upon formation of the photoelectric conversion layer.

First, as the experimental example 14 to the experimental example 16 that used three kinds of organic semiconductor materials, as in the experimental example 3, samples for the evaluation of the spectral characteristics and photoelectric conversion elements were fabricated using C60 as the first organic semiconductor material, the organic semiconductor material expressed by the formula (4-2) as the second organic semiconductor material, and the organic semiconductor material expressed by the formula (3-1) as the third organic semiconductor material. Evaporation speeds r1 (the first organic semiconductor material), r2 (the second organic semiconductor material), and r3 (the third organic semiconductor material) of the respective organic semiconductor materials were as follows. In the experimental example 14, r1=0.01 nm/second, r2=0.07 nm/second, and r3=0.03 nm/second. In the experimental example 15, r1=0.06 nm/second, r2=0.05 nm/second, and r3=0.04 nm/second. In the experimental example 16, r1=0.07 nm/second, r2=0.05 nm/second, and r3=0.08 nm/second.

In addition, as the experimental example 17 and the experimental example 18 that used two kinds of organic semiconductor materials, as in the experimental example 8, sample for the evaluation of the spectral characteristics and photoelectric conversion elements were fabricated, using C60 as the first organic semiconductor material and the organic semiconductor material expressed by the formula (3-1) as the second organic semiconductor material. Evaporation speeds r1 (the first organic semiconductor material) and r2 (the second organic semiconductor material) of the respective organic semiconductor materials were as follows. In the experimental example 17, r1=0.01 nm/second and r2=0.1 nm/second. In the experimental example 18, r1=0.07 nm/second and r2=0.03 nm/second.

For the experimental examples 14 to 18, the spectral characteristics, the external quantum efficiency, and the responsivity thereof were evaluated using a method similar to the above-described method. Table 5 is a summary of evaluation results of the evaporation speed, the spectral characteristics, the external quantum efficiency, and the responsivity of the respective organic semiconductor materials of the experimental examples 14 to 18 together with the experimental example 3 and the experimental example 8. It is to be noted that values related to the EQE and the response speed listed in Table 5 are relative values in a case where values of the experimental example 2 in the experiment 3 are references.

TABLE 5

| | r1 | r2 | r3 | EQE | Response Speed | Spectral Shape |
|---|---|---|---|---|---|---|
| Experimental example 3 | 0.05 | 0.075 | 0.075 | 1.02 | 0.5 | A |
| Experimental example 14 | 0.01 | 0.07 | 0.03 | 1.00 | 1.1 | A |
| Experimental example 15 | 0.06 | 0.05 | 0.04 | 1.03 | 0.4 | B |
| Experimental example 16 | 0.07 | 0.05 | 0.08 | 1.00 | 0.4 | B |
| Experimental example 8 | 0.02 | 0.08 | — | 1.01 | 0.9 | A |
| Experimental example 17 | 0.01 | 0.1 | — | 0.70 | 1.1 | A |
| Experimental example 18 | 0.07 | 0.03 | — | 0.50 | 0.3 | B |

As can be seen from Table 5, in comparison with the experimental example 3 and the experimental example 8, at least any of the EQE, the responsivity, and the spectral shape was poor in the experimental examples 14 to 16 and the experimental examples 17 and 18. That is, it was found that the photoelectric conversion element 10A and the photoelectric conversion element 10B described in the foregoing first and second embodiments was able to enhance the response speed without sacrificing the EQE and the spectral shape.

In addition, as in the experimental example 14, in a case where the content of the second organic semiconductor material is more than 60 volume %, it is desirable that at least the content of the third organic semiconductor material be 25 volume % or more to maintain the spectral shape. As a result, the content of the first organic semiconductor material is less than 10 volume %. In the experimental example 14, the response speed decreased. Furthermore, in the experimental example 15 and the experimental example 16 in which the content of the first organic semiconductor material was more than 30 volume %, the spectral shape deteriorated. It was found from this that in a case where the photoelectric conversion layer was formed using three kinds of organic semiconductor materials, the respective organic semiconductor materials were preferably contained in the following ranges. That is, the first organic semiconductor material is preferably contained in a range of 10 volume % or more and 30 volume % or less, for example. The second organic semiconductor material is preferably contained in a range of 10 volume % or more and 60 volume % or less, for example. The third organic semiconductor material is preferably contained in a range of 25 volume % or more and 90 volume % or less.

In addition, it was found that as in the experimental example 17, in a case where the content of the first organic semiconductor material was 10 volume % or less, the response speed deteriorated. In contrast, it was found that as in the experimental example 18, in a case where the content of the first organic semiconductor material was 35 volume % or more, the response speed was improved, but the spectral shape deteriorated. It was found from this that in a case where the photoelectric conversion layer was formed using two kinds of organic semiconductor materials, the respective organic semiconductor materials were preferably contained in the following ranges. That is, the first organic semiconductor material is preferably contained in a range of 10 volume % or more and 35 volume % or less, for example, and the second organic semiconductor material is preferably contained in a range of 65 volume % or more and 90 volume % or less, for example.

Although the description has been given by referring to the first and second embodiments and the examples, the contents of the present disclosure are not limited to the foregoing embodiments, etc., and may be modified in a variety of ways. For example, in the foregoing first embodiment, although the photoelectric conversion element has a configuration in which the organic photoelectric converter 20 detecting green light and the inorganic photoelectric converters 32B and 32R respectively detecting blue light and red light are stacked, the contents of the present disclosure is not limited to such a configuration. That is, the organic photoelectric converter may detect red light or blue light, and the inorganic photoelectric converter may detect green light.

Moreover, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be obtained by only the organic photoelectric converter. Further, the content of the present disclosure is not limited to a configuration in which organic photoelectric converters and inorganic photoelectric converters are stacked along the vertical direction, and organic photoelectric converters and inorganic photoelectric converters may be disposed side by side along a substrate surface.

Furthermore, in the first and second embodiments, the configuration of the back-side illumination type solid-state imaging apparatus has been exemplified; however, the contents of the present disclosure are applicable to a front-side illumination type solid-state imaging apparatus. In addition, it is not necessary that the solid-state imaging apparatus and the photoelectric conversion element of the present disclosure include all of the respective components described in the foregoing embodiments, etc. Alternatively, the solid-state imaging apparatus and the photoelectric conversion element may include any other layer.

Furthermore, the technology of the present disclosure is applicable not only to the solid-state imaging apparatus but also to a solar cell, for example.

It is to be noted that the effects described herein are merely illustrative and non-limiting, and other effects may be included.

Moreover, the technology may have the following configurations.

(1) A photoelectric conversion element including:
a first electrode and a second electrode opposed to each other; and
a photoelectric conversion layer provided between the first electrode and the second electrode, and including a first organic semiconductor material and a second organic semiconductor material that have mutually different mother skeletons,
in which the first organic semiconductor material is fullerene or a fullerene derivative, and
the second organic semiconductor material has a deeper HOMO level than the first organic semiconductor material.

(2)
The photoelectric conversion element according to (1), in which the second organic semiconductor material in a form of a single-layer film has a higher linear absorption coefficient of a maximal absorption wavelength in a visible region than a single-layer film of the first organic semiconductor material.

(3)
The photoelectric conversion element according to (1) or (2), in which in the photoelectric conversion layer, excitons generated by light absorption of the second organic semiconductor material are dissociated at an interface between the first organic semiconductor material and the second organic semiconductor material.

(4)
The photoelectric conversion element according to (1), in which
the photoelectric conversion layer further includes a third organic semiconductor material, and
the third organic semiconductor material in a form of a single-layer film has a higher linear absorption coefficient of a maximal absorption wavelength in a visible region than a single-layer film of the first organic semiconductor material and a single-layer film of the second organic semiconductor material.

(5)
The photoelectric conversion element according to (4), in which the second organic semiconductor material has a deeper LUMO level than the third organic semiconductor material, and higher electron mobility in a form of a single-layer film than electron mobility in a form of a single-layer film of the first organic semiconductor material and the third organic semiconductor material.

(6)
The photoelectric conversion element according to (4) or (6), in which in the photoelectric conversion layer, excitons generated by light absorption of the third organic semiconductor material are dissociated at an interface between any two kinds of materials of the first organic semiconductor material, the second organic semiconductor material, and the third organic semiconductor material.

(7)
The photoelectric conversion element according to any one of (1) to (6), in which the photoelectric conversion element has a maximal absorption wavelength within a range of 450 nm or higher and 650 nm or lower.

(8) The photoelectric conversion element according to any one of (1) to (3) and (7), in which the second organic semiconductor material is one or more kinds of subphthalocyanine and a subphthalocyanine derivative.

(9) The photoelectric conversion element according to any one of (4) to (7), in which the second organic semiconductor material is one or more kinds of hexaazatrinaphthylene, a hexaazatrinaphthylene derivative, naphthalene tetracarboxylic dianhydride, a naphthalene tetracarboxylic dianhydride derivative, naphthalene diimide, and a naphthalene diimide derivative.

(10) The photoelectric conversion element according to any one of (4) to (7) and (9), in which the third organic semiconductor material is subphthalocyanine or a subphthalocyanine derivative.

(11) The photoelectric conversion element according to any one of (1) to (10), in which an organic photoelectric converter including one or a plurality of the photoelectric conversion layers, and one or a plurality of inorganic photoelectric converters are stacked, the inorganic photoelectric converters performing photoelectric conversion in a different wavelength range from the organic photoelectric converter.

(12) The photoelectric conversion element according to (11), in which
the inorganic photoelectric converter is formed to be embedded in a semiconductor substrate, and
the organic photoelectric converter is formed on a side on which a first surface is located of the semiconductor substrate.

(13) The photoelectric conversion element according to (12), in which a multilayer wiring layer is formed on a side on which a second surface is located of the semiconductor substrate.

(14) The photoelectric conversion element according to (12) or (13), in which
the organic photoelectric converter performs photoelectric conversion of green light, and
an inorganic photoelectric converter that performs photoelectric conversion of blue light and an inorganic photoelectric converter that performs photoelectric conversion of red light are stacked inside the semiconductor substrate.

(15) A solid-state imaging apparatus provided with a plurality of pixels each including one or a plurality of photoelectric conversion elements, each of the photoelectric conversion elements including:
a first electrode and a second electrode opposed to each other; and
a photoelectric conversion layer provided between the first electrode and the second electrode, and including a first organic semiconductor material and a second organic semiconductor material that have mutually different mother skeletons,
in which the first organic semiconductor material is fullerene or a fullerene derivative, and
the second organic semiconductor material has a deeper HOMO level than the first organic semiconductor material.

This application claims the benefits of Japanese Priority Patent Application No. 2016-142547 filed with the Japan Patent Office on Jul. 20, 2016, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

What is claimed is:

1. A photoelectric conversion element comprising:
a first electrode and a second electrode opposed to each other; and
a photoelectric conversion layer provided between the first electrode and the second electrode, and including a first organic semiconductor material and a second organic semiconductor material that have mutually different mother skeletons,
wherein the first organic semiconductor material is a fullerene or a fullerene derivative, and
the second organic semiconductor material has a deeper HOMO level than the first organic semiconductor material.

2. The photoelectric conversion element according to claim 1, wherein the second organic semiconductor material in a form of a single-layer film has a higher linear absorption coefficient of a maximal absorption wavelength in a visible region than a single-layer film of the first organic semiconductor material.

3. The photoelectric conversion element according to claim 1, wherein in the photoelectric conversion layer, excitons generated by light absorption of the second organic semiconductor material are dissociated at an interface between the first organic semiconductor material and the second organic semiconductor material.

4. The photoelectric conversion element according to claim 1, wherein
the photoelectric conversion layer further includes a third organic semiconductor material, and
the third organic semiconductor material in a form of a single-layer film has a higher linear absorption coefficient of a maximal absorption wavelength in a visible region than a single-layer film of the first organic semiconductor material and a single-layer film of the second organic semiconductor material.

5. The photoelectric conversion element according to claim 4, wherein the second organic semiconductor material has a deeper LUMO level than the third organic semiconductor material, and higher electron mobility in a form of a single-layer film than electron mobility in a form of a single-layer film of the first organic semiconductor material and the third organic semiconductor material.

6. The photoelectric conversion element according to claim 4, wherein in the photoelectric conversion layer, excitons generated by light absorption of the third organic semiconductor material are dissociated at an interface between any two kinds of materials of the first organic semiconductor material, the second organic semiconductor material, and the third organic semiconductor material.

7. The photoelectric conversion element according to claim 4, wherein the second organic semiconductor material is one or more kinds of hexaazatrinaphthylene, a hexaazatrinaphthylene derivative, naphthalene tetracarboxylic dianhydride, a naphthalene tetracarboxylic dianhydride derivative, naphthalene diimide, and a naphthalene diimide derivative.

8. The photoelectric conversion element according to claim 4, wherein the third organic semiconductor material is subphthalocyanine or a subphthalocyanine derivative.

9. The photoelectric conversion element according to claim 1, wherein the photoelectric conversion element has a maximal absorption wavelength within a range of 450 nm or higher and 650 nm or lower.

10. The photoelectric conversion element according to claim 1, wherein the second organic semiconductor material is one or more kinds of subphthalocyanine and a subphthalocyanine derivative.

11. The photoelectric conversion element according to claim 1, wherein an organic photoelectric converter including one or a plurality of the photoelectric conversion layers, and one or a plurality of inorganic photoelectric converters are stacked, the inorganic photoelectric converters performing photoelectric conversion in a different wavelength range from the organic photoelectric converter.

12. The photoelectric conversion element according to claim 11, wherein
the inorganic photoelectric converter is formed to be embedded in a semiconductor substrate, and
the organic photoelectric converter is formed on a side on which a first surface is located of the semiconductor substrate.

13. The photoelectric conversion element according to claim 12, wherein a multilayer wiring layer is formed on a side on which a second surface is located of the semiconductor substrate.

14. The photoelectric conversion element according to claim 12, wherein
the organic photoelectric converter performs photoelectric conversion of green light, and
an inorganic photoelectric converter that performs photoelectric conversion of blue light and an inorganic photoelectric converter that performs photoelectric conversion of red light are stacked inside the semiconductor substrate.

15. A solid-state imaging apparatus provided with a plurality of pixels each including one or a plurality of photoelectric conversion elements, each of the photoelectric conversion elements comprising:
a first electrode and a second electrode opposed to each other; and
a photoelectric conversion layer provided between the first electrode and the second electrode, and including a first organic semiconductor material and a second organic semiconductor material that have mutually different mother skeletons,
wherein the first organic semiconductor material is a fullerene or a fullerene derivative, and
the second organic semiconductor material has a deeper HOMO level than the first organic semiconductor material.

* * * * *